United States Patent
Hudyma et al.

(10) Patent No.: US 7,151,592 B2
(45) Date of Patent: Dec. 19, 2006

(54) PROJECTION SYSTEM FOR EUV LITHOGRAPHY

(75) Inventors: Russell Hudyma, San Ramon, CA (US); Hans-Jürgen Mann, Oberkochen (DE); Udo Dinger, Oberkochen (DE)

(73) Assignee: Carl Zeiss SMT AG, Oberkochen (DE)

(*) Notice: Subject to any disclaimer, the term of this patent is extended or adjusted under 35 U.S.C. 154(b) by 0 days.

(21) Appl. No.: 10/454,830

(22) Filed: Jun. 4, 2003

(65) Prior Publication Data

US 2004/0070743 A1 Apr. 15, 2004

Related U.S. Application Data

(63) Continuation of application No. PCT/EP02/00030, filed on Jan. 4, 2002, and a continuation-in-part of application No. 10/004,674, filed on Dec. 3, 2001, now Pat. No. 6,600,552, which is a continuation-in-part of application No. 09/503,640, filed on Feb. 14, 2000, now Pat. No. 6,353,470.

(60) Provisional application No. 60/260,799, filed on Jan. 9, 2001.

(30) Foreign Application Priority Data

Feb. 15, 1999 (DE) ................ 199 06 001
Oct. 7, 1999 (DE) ................ 199 48 240

(51) Int. Cl.
*G03B 27/54* (2006.01)
*G03B 27/72* (2006.01)
*G02B 5/10* (2006.01)

(52) U.S. Cl. ............................ 355/67; 355/71; 359/859
(58) Field of Classification Search ................. 355/53, 355/55, 67–71; 359/366, 731, 856–858, 359/859
See application file for complete search history.

(56) References Cited

U.S. PATENT DOCUMENTS

| 4,701,035 A | 10/1987 | Hirose ................ 350/505 |
| 4,757,354 A | 7/1988 | Sato et al. |
| 5,063,586 A | 11/1991 | Jewell et al. ............ 378/34 |

(Continued)

FOREIGN PATENT DOCUMENTS

| DE | 199 06 001 | 2/1999 |
| DE | 19948240 | 10/1999 |
| DE | 199 48 240 | 8/2000 |

(Continued)

OTHER PUBLICATIONS

"Design of Reflective Relay For Soft X-Ray Lithography", by Rodgers and Jewell, SPIE vol. 1354 International Lens Design Conference (1990).

(Continued)

*Primary Examiner*—Henry Hung Nguyen
(74) *Attorney, Agent, or Firm*—Ohlandt, Greeley, Ruggiero & Perle, L.L.P.

(57) ABSTRACT

An EUV optical projection system includes at least six mirrors (M1, M2, M3, M4, M5, M6) for imaging an object (OB) to an image (IM). At least one mirror pair is preferably configured as an at least phase compensating mirror pair. The system is preferably configured to form an intermediate image (IMI) along an optical path from the object (OB) to the image (IM) between a second mirror (M2) and a third mirror (M3), such that a first mirror (M1) and the second mirror (M2) form a first optical group (G1) and the third mirror (M3), a fourth mirror (M4), a fifth mirror (M5) and a sixth mirror (M6) form a second optical group (G1). The system also preferably includes an aperture stop (APE) located along the optical path from the object (OB) to the image (IM) between the first mirror (M1) and the second mirror (M2). The second mirror (M2) is preferably convex, and the third mirror (M3) is preferably concave. The system preferably forms an image (IM) with a numerical aperture greater than 0.18.

31 Claims, 8 Drawing Sheets

U.S. PATENT DOCUMENTS

| | | | |
|---|---|---|---|
| 5,071,240 A | 12/1991 | Ichihara et al. | 359/366 |
| 5,078,502 A | 1/1992 | Cook | 359/366 |
| 5,153,898 A | 10/1992 | Suzuki et al. | 378/34 |
| 5,212,588 A | 5/1993 | Viswanathan et al. | 359/355 |
| 5,220,590 A | 6/1993 | Bruning et al. | 378/34 |
| 5,272,568 A | 12/1993 | DeJager | 359/758 |
| 5,315,629 A | 5/1994 | Jewell et al. | 378/34 |
| 5,353,322 A | 10/1994 | Bruning et al. | 378/34 |
| 5,410,434 A | 4/1995 | Shafer | 359/858 |
| 5,686,728 A | 11/1997 | Shafer | 250/492.2 |
| 5,805,365 A | 9/1998 | Sweatt | 359/858 |
| 5,815,310 A | 9/1998 | Williamson | 359/365 |
| 5,956,192 A | 9/1999 | Williamson | 359/859 |
| 5,973,826 A | 10/1999 | Chapman et al. | 359/355 |
| 6,014,252 A | 1/2000 | Shafer | 359/355 |
| 6,033,079 A * | 3/2000 | Hudyma | 359/857 |
| 6,072,852 A | 6/2000 | Hudyma | 378/34 |
| 6,109,756 A * | 8/2000 | Takahashi | 359/857 |
| 6,142,641 A | 11/2000 | Cohen et al. | 359/859 |
| 6,172,825 B1 * | 1/2001 | Takahashi | 359/859 |
| 6,183,095 B1 | 2/2001 | Hudyma | 359/857 |
| 6,188,513 B1 * | 2/2001 | Hudyma et al. | 359/366 |
| 6,199,991 B1 * | 3/2001 | Braat | 359/856 |
| 6,226,346 B1 | 5/2001 | Hudyma | 378/34 |
| 6,255,661 B1 | 7/2001 | Braat | 250/492.2 |
| 6,262,836 B1 | 7/2001 | Hudyma et al. | 359/366 |
| 6,522,716 B1 * | 2/2003 | Murakami et al. | 378/34 |

FOREIGN PATENT DOCUMENTS

| | | |
|---|---|---|
| EP | 0 779 528 | 6/1997 |
| EP | 0779528 | 6/1997 |
| EP | 0779528 A2 | 6/1997 |
| EP | 0816892 A2 | 1/1998 |
| JP | 63014112 A | 1/1988 |
| JP | 07283116 | 10/1995 |
| WO | 9957596 | 11/1999 |
| WO | WO 99/57596 | 11/1999 |
| WO | WO 99/57606 | 11/1999 |
| WO | 0151979 | 7/2001 |
| WO | 0248796 | 6/2002 |

OTHER PUBLICATIONS

"*Phase Shifting Diffraction Interferometry for Measuring Extreme Ultraviolet Optics*", by Sommargren, *OSA TOPS on Extreme Ultraviolet Lithography*, 1996, vol. 4, Kubiak and Dania (eds.).

"*Ring-Field EUVL Camera With Large Etendu*", by Sweatt, *OSA TOPS on Extreme Ultraviolet Lithography*, 1996, vol. 4, Kubiak and Dania (eds.).

"*EUV Optical Design for a 100 nm CD Imaging System*", by Sweeney, Hudyma, Chapman, and Shafer, SPIE vol. 3331.

"*Optical System Design Issues in Development of Projection Camera for EUV Lithography*", Jewell, SPIE vol. 2437.

"*Reflective Systems Design Study for Soft X-Ray Projection Lithography*", by Jewell, Rodgers, and Thompson, *J. Vac. Sci. Tehnol. B 8* (6), Nov./Dec. 1990-American Vacuum Society.

European Search Report dated Nov. 28, 2005.

* cited by examiner

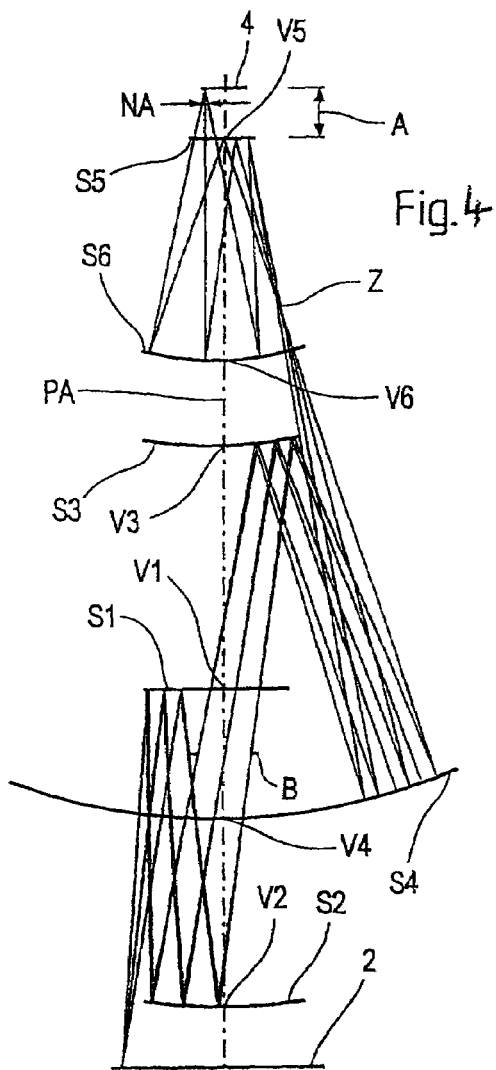
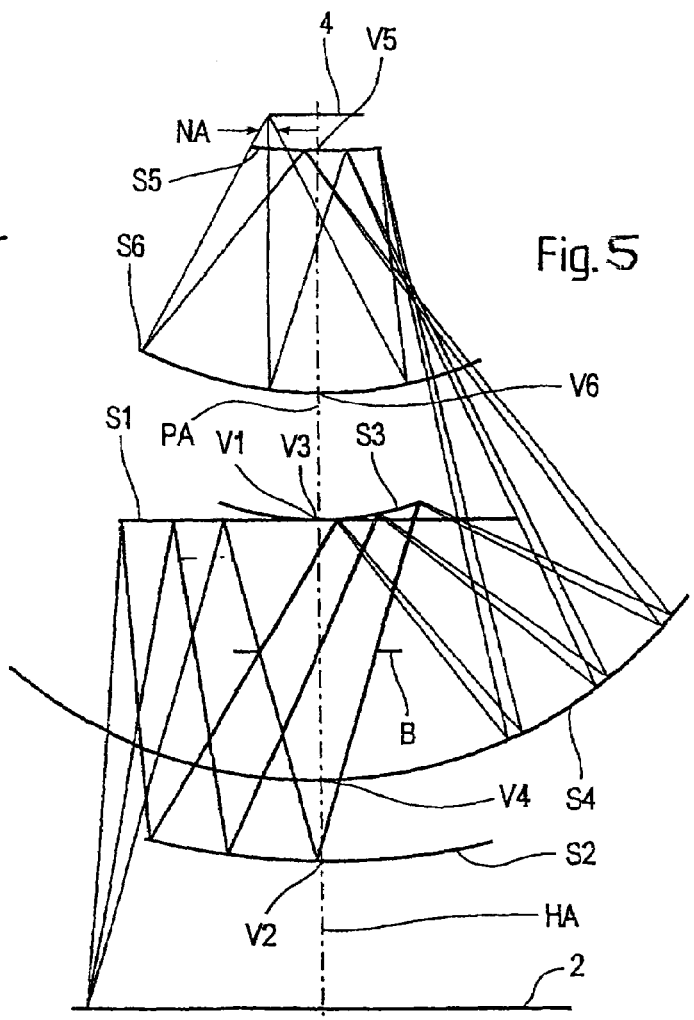
PRIOR ART

PROJECTION SYSTEM FOR EUV LITHOGRAPHY

CROSS-REFERENCE TO RELATED APPLICATIONS

The present application is a continuation of International Application No. PCT/EP02/00030 and a continuation in part of U.S. patent application Ser. No. 10/004,674. The PCT/EP02/00030 application was filed Jan. 4, 2002, and claims priority of U.S. Provisional Patent Application Ser. No. 60/260,799, which was filed Jan. 9, 2001. The Ser. No. 10/004,674 application was filed Dec. 3, 2001 which is now U.S. Pat. No. 6,600,552 and is a continuation-in-part of U.S. patent application Ser. No. 09/503,640. The Ser. No. 09/503,640 application was filed Feb. 14, 2000 and issued as U.S. Pat. No. 6,353,470. The present application is also claiming priority of (a) German Patent Application No. 19906001 filed Feb. 15, 1999, and (b) German Patent Application No. 199 48 240 filed Oct. 7, 1999.

BACKGROUND OF THE INVENTION

1. Field of the Invention

The present invention relates to a microlithography objective, a projection exposure apparatus containing the objective, and a method of manufacturing an integrated circuit using the same, and more particularly, an optical projection system for extreme ultraviolet (EUV) lithography, particularly including six mirrors arranged in two optical groups.

2. Description of the Related Art

It is widely accepted that current deep ultraviolet (DUV) projection printing systems used in a step and scan mode will be able to address the needs of the semiconductor industry for the next two or three device nodes. The next generation of photolithographic printing systems will use exposure radiation having soft x-ray or extreme ultraviolet wavelengths of approximately 11 nm to 15 nm, also in a step and scan printing architecture. To be economically viable, these next generation systems will require a sufficiently large numerical aperture to address sub 70 nm integrated circuit design rules. Further, these photolithography systems will require large fields of view in the scan direction to ensure that the throughput (defined in terms of wafers per hour) is sufficiently great so that the process is economically viable.

The theoretical resolution (R) of a lithographic printing system can be expressed by the well-known relationship $R=k_1 \lambda/NA$, where $k_1$ is a process dependent constant, $\lambda$ is the wavelength of light, and NA is the numerical aperture of the projection system. Knowing that EUV resists support a $k_1$-factor of ~0.5 and assuming a numerical aperture of 0.20, an EUV projection system can achieve a theoretical resolution on the order of approximately 30 nm with $\lambda=13.4$ nm. It is recognized in the present invention that all reflective projection systems for EUV lithography for use in a step and scan architecture having both a large numerical aperture (0.20 to 0.30) and a large field (2 to 3 mm) are desired to address the sub-50 nm linewidth generations as defined by the International Sematech's International Technology Roadmap for Semiconductors (1999).

Four-mirror projection systems, such as those described in U.S. Pat. Nos. 5,315,629 and 6,226,346, issuing to Jewel and Hudyma, respectively, lack the degrees of freedom necessary to correct aberrations over a sufficiently large NA to achieve 30 nm design rules. The '346 patent teaches that a four-mirror projection system can be used to correct aberrations at a numerical aperture up to 0.14, which supports 50 nm design rules. However, it is desired that the width of the ring field be reduced to enable wavefront correction to the desired level for lithography. The '346 patent demonstrates that the ring field is reduced from 1.5 mm to 1.0 mm as a numerical aperture is increased from 0.10 to 0.12. Further scaling of the second embodiment in the '346 patent reveals that the ring field must be reduced to 0.5 mm as a numerical aperture is increased further to 0.14. This reduction in ring field width results directly in reduced throughput of the entire projection apparatus. Clearly, further advances are needed.

Five-mirror systems, such as that set forth in U.S. Pat. No. 6,072,852, issuing to Hudyma, have sufficient degrees of freedom to correct both the pupil dependent and field dependent aberrations, thus enabling numerical apertures in excess of 0.20 over meaningful field widths (>1.5 mm). While minimizing the number of reflections has several advantages particular to EUV lithography, an odd number of reflections create a problem in that new stage technology would need to be developed to enable unlimited parallel scanning. To "unfold" the system to enable unlimited synchronous parallel scanning of the mask and wafer with existing scanning stage technologies, it is recognized herein that an additional mirror should be incorporated into the projection system.

Optical systems for short wavelength projection lithography utilizing six or more reflections have been disclosed in the patent literature.

One early six mirror system is disclosed in U.S. Pat. No. 5,071,240, issuing to Ichihara and Higuchi entitled, "Reflecting optical imaging apparatus using spherical reflectors and producing an intermediate image." The '240 patent discloses a 6-mirror catoptric or all-reflective reduction system utilizing spherical mirrors. This particular embodiment is constructed with three mirror pairs and uses positive/negative (P/N) and negative/positive (N/P) combinations to achieve the flat field condition. Ichihara and Higuchi also demonstrate that the flat field imaging condition (zero Petzval sum) can be achieved with a system that utilizes an intermediate image between the first mirror pair and last mirror pair. The patent teaches the use of a convex secondary mirror with an aperture stop that is co-located at this mirror. It is also clear from examination of the embodiments that the '240 patent teaches the use of low incidence angles at each of the mirror surfaces to ensure compatibility with reflective coatings that operate at wavelengths around 10 nm.

While the embodiments disclosed in the '240 patent appear to achieve their stated purpose, these examples are not well suited for contemporary lithography at extreme ultraviolet wavelengths. First, the systems are very long (~3000 mm) and would suffer mechanical stability problems. Second, the embodiments do not support telecentric imaging at the wafer which is desired for modern semiconductor lithography printing systems. Lastly, the numerical aperture is rather small (~0.05) leaving the systems unable to address 30 nm design rules.

Recently, optical projection production systems have been disclosed that offer high numerical apertures with at least six reflections designed specifically for EUV lithography. One such system is disclosed in U.S. Pat. No. 5,815,310, entitled, "High numerical aperture ring field optical projection system," issuing to Williamson. In the '310 patent, Williamson describes a six-mirror ring field projection system intended for use with EUV radiation. Each of the mirrors is aspheric and share a common optical axis. This particular embodiment has a numerical aperture of 0.25 and is capable of 30 nm lithography using conservative (~0.6) values for $k_1$. This particular embodiment consists, from long conjugate to short conjugate, of a concave, convex, concave, concave, convex and concave mirror, or PNPPNP for short.

The preferred EUV embodiment disclosed in the '310 patent suffers from several drawbacks, one of which is the high incidence angles at each of the mirrored surfaces, particularly on mirrors M2 and M3. In some instances, the angle of incidence exceeds 24° at a given location on the mirror. Both the mean angle and deviation or spread of angles at a given point on a mirror surface is sufficient to cause noticeable amplitude and phase effects due to the EUV multilayer coatings that might adversely impact critical dimension (CD control).

Two other catoptric or all-reflective projection systems for lithography are disclosed in U.S. Pat. No. 5,686,728 entitled, "Projection lithography system and method using all-reflective optical elements," issuing to Shafer. The '728 patent describes an eight mirror projection system with a numerical aperture of about 0.50 and a six-mirror projection system with a numerical aperture of about 0.45 intended for use at wavelengths greater than 100 nm. Both systems operate in reduction with a reduction ratio of 5×. Like the systems described in the '310 patent, these systems have an annular zone of good optical correction yielding lithography performance within an arcuate shaped field. While these systems were designed for DUV lithography and are fine for that purpose, these embodiments make very poor EUV projection systems. Even after the numerical aperture is reduced from 0.50 to 0.25, the incidence angles of the ray bundles are very large at every mirror including the mask, making the system incompatible with either Mo/Si or Mo/Be multilayers. In addition, both the aspheric departure and aspheric gradients across the mirrors are rather large compared to the EUV wavelength, calling into question whether or not such aspheric mirrors can be measured to a desired accuracy for EUV lithography. Recognizing these issues, the '728 patent explicitly teaches away from using catoptric or all-reflective projection systems at EUV wavelengths and instead restricts their use to longer DUV wavelengths.

Another projection system intended for use with EUV lithography is disclosed in U.S. Pat. No. 6,033,079, issuing to Hudyma. The '079 patent entitled, "High numerical aperture ring field projection system for extreme ultraviolet lithography," describes two preferred embodiments. The first embodiment that the '079 patent describes is arranged with, from long to short conjugate, a concave, concave, convex, concave, convex, and concave mirror surfaces (PPNPNP). The second preferred embodiment from the '079 patent has, from long to short conjugate, a concave, convex, convex, concave, convex, and concave mirror surfaces (PNNPNP). The '079 patent teaches that both PPNPNP and PNNPNP reimaging configurations are advantageous with a physically accessible intermediate image located between the fourth and fifth mirror. In a manner similar to the '240 and '310 patents, the '079 patent teaches the use of an aperture stop at the secondary mirror and a chief ray that diverges from the optical axis after the secondary mirror.

The '079 patent teaches that the use of a convex tertiary mirror enables a large reduction in low-order astigmatism. This particular arrangement of optical power is advantageous for achieving a high level of aberration correction without using high incidence angles or extremely large aspheric departures. For both embodiments, all aspheric departures are below 15 μm and most are below 10 μm. Like the '240 patent, the '079 patent makes a significant teaching related to EUV via the use of low incidence angles on each of the reflective surfaces. The PPNPNP and PNNPNP power arrangements promote low incidence angles thus enabling simple and efficient EUV mirror coatings. The low incidence angles work to minimize coating-induced amplitude variations in the exit pupil, minimize coating-induced phase or optical path difference (OPD) variations in the exit pupil, and generally lower the tolerance sensitivity of the optical system. These factors combine to promote improved transmittance and enhanced CD uniformity in the presence of variations in focus and exposure.

While the prior art projection optical systems have proven adequate for many applications, they're not without design compromises that may not provide an optimum solution in all applications. Therefore, there is a need for a projection optical system that can be used in the extreme ultraviolet (EUV) or soft X-ray wavelength region that has a relatively large image field with capable of sub 50 nm resolution.

SUMMARY OF THE INVENTION

In view of the above, an EUV optical projection system is also provided including at least six reflecting surfaces for imaging an object, wherein at least one mirror pair is configured as an at least partially phase compensating mirror pair which provides compensation for multilayer-induced phase errors. The mirror pair may include preferably the second and fifth mirrors. A mirror pair is at least partially phase compensating if the difference of the mean incidence angles of a ray bundle from a central field point at the mirrors of the at least partially phase compensating mirror pair is minimized. This difference should be less than 5°, preferably less than 4°. The difference in incidence angle variation in the tangential plane across the mirrors of the at least partially phase compensating mirror pair for said ray bundle should be also minimized. This difference should be less than 5°, preferably less than 4°.

The system may include an aperture stop located along an optical path from the object to the image between a first mirror and a second mirror. The aperture stop may be disposed off each of the first mirror and the second mirror. The second mirror may be convex, while the third mirror may be concave.

In further view of the above, an EUV optical projection system is also provided including at least six reflecting surfaces for imaging a object, and an aperture stop located along an optical path from the object to the image between a first mirror and a second mirror. The second mirror is convex, and the third mirror is concave.

The aperture stop may be disposed off each of the first mirror and the second mirror. The system may also include at least one mirror pair configured as an at least partially phase compensating mirror pair which provides compensation for multilayer-induced phase errors. The mirror pair may include the second and fifth mirrors.

The system may be further configured to form an intermediate image along an optical path from the object to the image between a second mirror and a third mirror, such that a first mirror and the second mirror form a first optical group and the third mirror, a fourth mirror, a fifth mirror and a sixth mirror form a second optical group. A magnification ratio of the first optical group may be between −0.8 and −1.2, and a magnification ratio of the second optical group may be between −0.15 and −0.35.

In further view of the above, an EUV optical projection system is also provided including at least six reflecting surfaces for imaging an object, wherein an intermediate image is formed along an optical path from the object to the image between a second mirror and a third mirror, such that a first mirror and the second mirror form a first optical group and the third mirror, a fourth mirror, a fifth mirror and a sixth mirror form a second optical group. The second mirror is convex, while the third mirror is concave.

The system may further include an aperture stop located along the optical path from the object to the image between the first mirror and the second mirror. The aperture stop may be disposed off each of the first mirror and the second mirror. The system may also include at least one mirror pair configured as an at least partially phase compensating mirror pair that compensates for multilayer-induced phase errors. The mirror pair may include the second and fifth mirrors.

Any of these systems may be further configured such that a chief ray diverges away from the optical axis while propagating between the second mirror and the third mirror. The first mirror may be preferably concave, the second mirror convex, the third mirror concave, the fourth mirror concave, the fifth mirror convex and the sixth mirror concave. The physical distance between the object and the image may be substantially 1500 mm or less. An image is preferably formed with a numerical aperture greater than 0.18.

Each of the six reflecting surfaces preferably receives a chief ray from a central field point at an incidence angle of less than substantially 16°, and five of the six reflecting surfaces preferably receive a chief ray from a central field point at an incidence angle of less than substantially 13°. A beam propagating between second and third mirrors along an optical path between the object and the image and a beam propagating between fourth and fifth mirrors may preferably cross in the y-axis direction. A maximum aspheric departure of a sixth mirror along an optical path from the object to the image from a best fitting sphere may be preferably less than substantially 6 μm. The system is preferably configured to have a RMS wavefront error of 0.017λ or less.

In another embodiment, the shortcomings of the prior art are overcome by a projection objective having an object plane and an image plane and a light path for a bundle of light rays from the object plane to the image plane. The six mirrors of the objective are arranged in the light path from the object plane to the image plane. In such an embodiment the mirror closest to the image plane where e.g. an object to be illuminated such as a wafer is situated is arranged in such a way that an image-side numerical aperture is $NA \geq 0.15$. In this application the image-side numerical aperture is understood to be the numerical aperture of the bundle of light rays impinging onto the image plane. Furthermore, the mirror arranged closest to the image plane of the objective is arranged in such a way that the image-side free working distance corresponds at least to the used diameter of the mirror next to the wafer. In a preferred embodiment the image-side free working distance is at least the sum of one-third of the used diameter of the mirror next to the image plane and a length between 20 and 30 mm. In an alternative embodiment the image-side free working distance is at least 50 mm. In a particularly preferred embodiment, the image-side free working distance is 60 mm. In this application the free working distance is defined as the distance of the vertex of the surface of the mirror next to the image plane and the image plane. All surfaces of the six mirrors in this application are rotational-symmetric about a principal axis (PA). The vertex of a surface of a mirror is the intersection point of the surface of a mirror with the principal axis (PA). Each mirror has a mirror surface. The mirror surface is the physical mirror surface upon which the bundle of light rays traveling through the objective from the object plane to the image plane impinge. The physical mirror surface or the used area of a mirror can be an off-axis or an on-axis mirror segment relative to the principal axis (PA).

In another embodiment, a projection objective that comprises six mirrors is characterized by an image-side numerical aperture, NA, greater than 0.15 and an arc-shaped field width, W, at the wafer in the range $1.0$ mm $\leq W$. The peak-to-valley deviation, A, of the aspheres are limited with respect to the best fitting sphere of the physical mirror surface of all mirrors by:

$$A \leq 19 \ \mu m - 102 \ \mu m(0.25-NA) - 0.7 \ \mu m/mm(2 \ mm-W).$$

In a preferred embodiment, the peak-to-valley distance A of the aspheres is limited with respect to the best fitting sphere of the off-axis segments of all mirrors by:

$$A \leq 12 \ \mu m - 64 \ \mu m(0.25-NA) - 0.3 \ \mu m/mm(2 \ mm-W).$$

According to yet another embodiment, a projection objective that includes six mirrors is characterized by an image-side numerical aperture $NA \geq 0.15$ and an image-side width of the arc-shaped field $W \geq 1$ mm, and the angles of incidence AOI are limited for all rays of the light bundle impinging a physical mirror surface on all six mirrors S1, S2, S3, S4, S5, S6 by:

$$AOI \leq 23° - 35°(0.25-NA) - 0.2°/mm(2 \ mm-W)$$

wherein the angles of incidence AOI refer to the angle between the incident ray and the normal to the physical mirror surface at the point of incidence. The largest angle of any incident bundle of light rays occurring on any of the mirrors is always given by the angle of a bundle-limiting ray.

Preferably, an embodiment of the invention would encompass all three of the above aspects, e.g., an embodiment in which the free optical working distance would be more than 50 mm at NA=0.20 and the peak-to-valley deviation of the aspheres, as well as the angles of incidence, would lie in the regions defined above.

The asphericities herein refer to the peak-to-valley (PV) deviation, A, of the aspherical surfaces with respect to the best fitting sphere of the physical mirror surface of an specific mirror. The physical mirror surface of a specific mirror is also denoted as the used area of this specific mirror. The aspherical surfaces are approximated in the examples by using a sphere. The sphere has a center on the figure axis vertex of the mirror. The sphere intersects the asphere in the upper and lower endpoint of the used area in the meridian section. The data regarding the angles of incidence always refer to the angle between the incident ray and the normal to the physical mirror surface at the point of incidence. The largest angle of any incident bundle of light rays occurring on any of the physical mirror surfaces is always given by the angle of a bundle-limiting ray. The used diameter or the diameter of the physical mirror surface will be defined here and below as the envelope circle diameter of the physical mirror surface or the used area of a mirror, which is generally not circular.

In a preferred embodiment the free working distance is 60 mm.

The objective can be used not only in the EUV, but also at other wavelengths, without deviating from the scope of the invention. In any respect, however, to avoid degradation of image quality, especially degradation due to central shading, the mirrors of the projection objectives should be arranged so that the light path of the bundle of light rays traveling from the object plane to the image plane is obscuration-free. Furthermore, to provide easy mounting and adjusting of the system, the physical mirror surfaces have a rotational symmetry to a principal axis (PA). Moreover, to have a compact design with an accessible aperture and to establish an obscuration-free light path of the bundle of light rays traveling from the object plane to the image plane, the projection objective device is designed in such a way that an intermediate image of the object situated in the object plane is formed after the fourth mirror. In such systems, it is possible that the aperture stop is situated in the front, low-aperture objective part, with a pupil plane conjugated to the aperture stop imaged in the focal plane of the last mirror. Such a system ensures telecentricity in the image plane.

In an preferred embodiment of the invention, the aperture stop is freely accessible and arranged in the light path from the object plane to the image plane between the second and third mirror. Good accessibility of the aperture stop is ensured when the ratio of the distance between the first and third mirror to the distance between the first and second mirror lies in the range of:

0.5<S1S3/S1S2<2.

As defined for the free working distance in general a distance between two mirrors is the distance of the vertices of the surfaces of these mirrors.

Furthermore, in order to prevent vignetting of the light running from the third to the fourth mirror, by the aperture stop arranged between the second and third mirror, the ratio of the distance between the second mirror and aperture stop to the distance between the third mirror and the aperture stop lies in the range:

0.5<S2 aperture/(S3 aperture)<2.

In such a system, the angles of incidence on the physical mirror surfaces in the front part of the objective are reduced.

An aperture stop which physically lies between the second mirror, S2, and the first mirror, S1, must be formed at least partially as a narrow ring in order to avoid clipping of light moving from S1 to S2. In such a design, there is a danger that undesirable direct light or light reflected on S1 and S2, will pass outside the aperture ring and reach the image plane and thus the wafer. However, if the aperture stop is placed in the light path between the second and third mirror and physically close to the first mirror (which can be easily achieved mechanically), an efficient masking of this undesired light is possible. The aperture stop can be designed both as an opening in the first mirror or an opening which is arranged behind the first mirror.

In another embodiment of the invention, the aperture stop is arranged on or near the second mirror. Arrangement of the aperture on a mirror has the advantage that it is easier to manufacture.

In order to ensure an obscuration-free ray path with simultaneously low angles of incidence, the ratio of the distance between the first and third mirrors (S1S3) to the distance between the first and second mirrors (S1S2) lies in the range:

0.3≦S1S3/S1S2≦2.0, while the ratio of the distance between the second and third mirrors (S2S3) to the distance between the third and fourth mirrors (S3S4) lies in the range:

0.7≦S2S3/S3S4≦1.4.

In order to be able to make the necessary corrections of imaging errors in the six-mirror systems, in a preferred embodiment, all six mirrors are designed to be aspherical. However, an alternative embodiment whereby at most five mirrors are aspherical can simplify the manufacturing, because it is then possible to design one mirror, preferably the largest mirror, i.e., the quaternary mirror, in the form of a spherical mirror. Moreover, it is preferred that the second to sixth mirror be in a concave-convex-concave-convex-concave sequence.

In order to achieve a resolution of at least 50 nm, the design part of the rms wavefront section of the system should be at most 0.07 λ and preferably 0.03 λ.

Advantageously, in the embodiments of the invention, the objectives are always telecentric on the image-side.

In projection systems which are operated with a reflection mask, a telecentric light path on the object-side is not possible without illumination through a beam splitter which reduces the transmission strongly. One such device is known from JP 95 28 31 16.

In systems with transmission mask, the projection objective can be telecentric on the object side. In these embodiments, the first mirror is preferably concave.

The telecentericity error in the image plane, where the the wafer is situated should not exceed 10 mrad and is typically between 5 mrad and 2 mrad, with 2 mrad being preferred. This ensures that changes of the imaging ratio remain within tolerable limits over the depth of focus.

In an preferred embodiments of the invention, the six mirror objective could comprise a field mirror, a reducing three-mirror subsystem and a two-mirror subsystem.

In addition to the projection objective also a projection exposure apparatus is shown, that includes at least a projection objective device. In a first embodiment, the projection exposure apparatus has a reflection mask, while in an alternative embodiment, it has a transmission mask. Preferably, the projection exposure apparatus includes an illumination device for illuminating an off-axis arc-shaped field and the system is designed as an arc-shaped field scanner. Furthermore, the secant length of the scan slit is at least 26 mm and the ring width is greater than 0.5 mm.

The invention will be described below with the aid of the drawings as examples.

BRIEF DESCRIPTION OF THE DRAWINGS

FIG. 4 shows an embodiment with an intermediate image, a freely accessible aperture stop between a second and third mirror, and a image side numerical aperture of 0.2.

FIG. 5 shows a prior art six-mirror objective arrangement for wavelengths >100 nm as disclosed in U.S. Pat. No. 5,686,728.

INCORPORATION BY REFERENCE

What follows is a cite list of references which, in addition to that which is described in the background and brief summary of the invention above, are hereby incorporated by reference into the detailed description of the preferred embodiments, as disclosing alternative embodiments of elements or features of the preferred embodiment not otherwise set forth in detail below. A single one or a combination of two or more of these references may be consulted to obtain a variation of the preferred embodiments described below. Further patent, patent application and non-patent references, and discussion thereof, cited in the background and/or elsewhere herein are also incorporated by reference into the detailed description of the preferred embodiments with the same effect as just described with respect to the following references:

U.S. Pat. Nos. 5,063,586, 5,071,240, 5,078,502, 5,153,898, 5,212,588, 5,220,590, 5,315,629, 5,353,322, 5,410,434, 5,686,728, 5,805,365, 5,815,310, 5,956,192, 5,973,826, 6,033,079, 6,014,252, 6,188,513, 6,183,095, 6,072,852, 6,142,641, 6,172,825, 6,226,346, 6,255,661 and 6,262,836;

European patent applications no. 0 816 892 A1 and 0 779 528 A; and

"Design of Reflective Relay for Soft X-Ray Lithography", J. M. Rodgers, T. E. Jewell, International Lens Design Conference, 1990;

"Reflective Systems design Study for Soft X-ray Projection Lithography", T. E. Jewell, J. M. Rodgers, and K. P. Thompson, J. Vac. Sci. Technol., November/December 1990.

"Optical System Design Issues in Development of Projection Camera for EUV Lithography", T. E. Jewell, SPIE Volume 2437, pages 340–347;

"Ring-Field EUVL Camera with Large Etendu", W. C. Sweatt, OSA TOPS on Extreme Ultraviolet Lithography, 1996; and "Phase Shifting Diffraction Interferometry for Measuring Extreme Ultraviolet Optics", G. E. Sommargaren, OSA TOPS on Extreme Ultraviolet Lithography, 1996;

"EUV Optical Design for a 100 nm CD Imaging System", D. W. Sweeney, R. Hudyma, H. N. Chapman, and D. Shafer, SPIE Volume 3331, pages 2–10.

DETAILED DESCRIPTION OF THE PREFERRED EMBODIMENTS

The specific preferred embodiment relating to this optical projection system is described.

Preferred Embodiment

Figure 1:
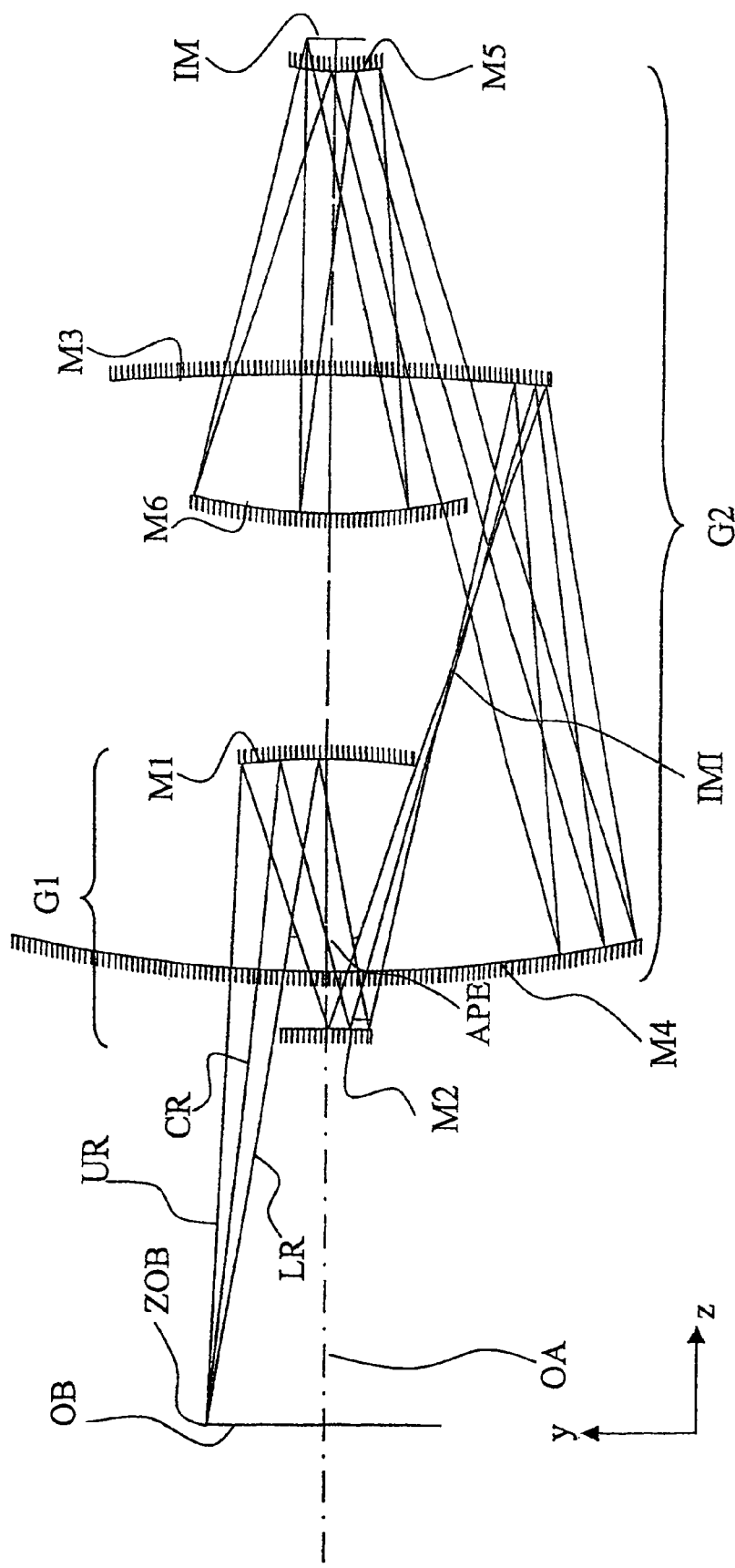
FIG. 1 shows a plan view of an EUV optical projection system according to a preferred embodiment.

FIG. 1 schematically illustrates a first preferred embodiment, and, taking in conjunction with Table 1 and Table 2, provides an illustrative, exemplary description of this embodiment. Light impinges on an object OB, e.g. a reflective mask or a reticle, from an illumination source and is directed to concave mirror M1 after which it reflects from the mirror and passes through a physically accessible aperture stop APE that is located between mirror M1 and mirror M2. This aperture stop APE is a substantial distance from the first concave mirror M1 and, likewise, this aperture stop APE is located a substantial distance from convex mirror M2. After the illumination reflects off convex mirror M2, the light comes to a focus at an intermediate image IMI that is located in close proximity to concave mirror M3. From mirror M3 the illumination is directed toward concave mirror M4 where the light is nearly collimated and directed toward convex mirror M5. Upon reflection from mirror M5, the light impinges on concave mirror M6 where it is reflected in a telecentric manner (the chief rays are parallel to the optical axis) and focused on an image IM. A semiconductor wafer is typically arranged at the position of the image IM. Since a concave optical surface has positive optical power (P) and a convex optical surface has negative optical power (N), this present embodiment may be characterized as a PNPPNP configuration.

Although there are many ways to characterize this optical system, one convenient way is to break the system into two groups G1 and G2. Starting at the object OB, the first group G1 is comprised the concave/convex mirror pair M1 and M2. This group forms an intermediate image IMI at a magnification of about −1× between mirror M2 and M3. The remaining four mirrors (concave mirror M3, concave mirror M4, convex mirror M5 and concave mirror M6) comprise the second imaging or relay group G2. This second group G2 works at a magnification of approximately −0.25×, resulting in 4× reduction (the reduction ratio is the inverse of the absolute value of the optical magnification) of the object OB at the image IM.

The optical prescription of the first embodiment of FIG. 1 is listed in Table 1 and Table 2. The aspheric mirror surfaces are labeled A(1)–A(6) in the tables with A(1) corresponding to mirror M1, A(2) corresponding to mirror M2, and so on. Four additional surfaces complete the description of this illustrative and exemplary embodiment with object OB and image IM representing the planes, where in a lithographic apparatus the mask and the wafer are arranged. A surface designation is also made for the location of the aperture stop APE and intermediate image IMI. After each surface designation, there are two additional entries listing the vertex radius of curvature (R) and the vertex spacing between the optical surfaces. In this particular embodiment, each of the surfaces is rotationally symmetric conic surface with higher-order polynomial deformations. The aspheric profile is uniquely determined by its K, A, B, C, D, and E values. Each mirror uses 4th, 6th, 8th, 10th, and 12th order polynomial deformations. The sag z of the aspheric surface (through 12th order) in the direction of the z-axis is given by:

$$z = \frac{ch^2}{1+\sqrt{1-(1+k)c^2h^2}} + Ah^4 + Bh^6 + Ch^8 + Dh^{10} + Eh^{12}$$

where h is the radial coordinate; c is the vertex curvature of the surface (1/R); K is the conic constant; and A, B, C, D, and E are the 4th, 6th, 8th, 10th, and 12th order deformation coefficients, respectively. These coefficients are listed in Table 2.

The optical system of this first preferred embodiment is designed to project a ring field format that is illuminated with extremely ultraviolet (EUV) or soft X-ray radiation. The numerical aperture at the object (NAO) is 0.055 radians; at a 4× reduction this corresponds to a numerical aperture NA of 0.22 at the image, which exceeds 0.18 as a desired threshold value. The ring field 21 at the object OB is shown with FIG. 2. It is centered at 120 mm from the optical axis OA, which contains the vertex of each of the aspheric mirrors. This annular field extends from 116 mm to 124 mm forming an arcuate slit with a width 23 of 8 mm. The extent 25 of the ring field 21 perpendicular to the scan direction 27 becomes 104 mm. The central field point is denoted with the reference sign COP. At 4× reduction, this ring field becomes 2.0 mm wide in the scan direction at the image IM.

As a result of the distribution of optical power and location of the aperture stop APE, the incidence angles are well controlled so that the design is compatible with EUV or soft X-ray multilayer coatings. As measured by the chief ray CR from the central field point COP, this system exhibits very low incidence angles ranging from 3.1° to 14.6°. The chief ray incidence angles from the central field point COP are: object OB: 5.7°; M1: 9.9°; M2: 14.6°; M3: 11.0°; M4: 4.4°, M5: 11.0°, and M6: 3.1°. Advantageously, each of the six mirrors receives a chief ray CR from a central field point COP at an incidence angle of less than substantially 16°, and five of the six mirrors receives a chief ray CR from a central field point COP at an incidence angle of less than substantially 13°. These low incidence angles are a key enabling element for EUV lithography since (1) they minimize the multilayer induced amplitude and phase errors that have an adverse impact to lithographic performance and (2) enable simplified coating designs that do not rely heavily on the use of laterally graded coating profiles. With poor design (i.e., failure to minimize these incidence angles), these multi-layer-induced amplitude and phase errors can lead to critical dimension (CD) errors that are easily greater than 20% of the nominal linewidth, making the system unusable for production applications.

Besides the low incidence angles, a preferred system further enables EUV lithography by utilizing mirrors with low peak aspheric departure. The maximum peak departure (as measured across the instantaneous clear aperture), contained on mirror M1, is 36 µm. The other mirrors have low-risk aspheres with departures that range from 2.5 µm to 14.0 µm. The low aspheric departures of the mirror surfaces facilitate visible light metrology testing without a null lens or Computer Generated Hologram (CGH), resulting in surface figure testing to a high degree of accuracy. An aspheric mirror with a very large peak departure is unproducible because it cannot be measured to the required accuracy to realize lithographic performance.

Table 3 summarizes the performance of the PNPPNP configuration of FIG. 1. The table demonstrates that this preferred embodiment is able to achieve lithographic performance with a resolution on the order of 30 nm (assuming a k1-factor of approximately 0.5). This performance is achieved by manipulating the balance of aberrations between the imaging groups G1 and G2. The PNPPNP is arranged so that the third order tangential astigmatism from the second group G2 (ignoring aspheric contributions to the third order aberration coefficients for the moment) is made very small. The coma contribution from the second group G2, again ignoring aspheric contributions, is overcorrected and large. Within the first group G1 group, the location of the aperture stop is selected so that the third order coma contribution from the PN pair is nearly balanced and the tangential astigmatism contribution from the convex secondary mirror M2 itself is made very small. Taking into account the aspheric contribution to the third order aberration coefficient, the strong hyperbolic profile on mirror M1 impacts a strongly undercorrected astigmatic contribution as well as a strongly undercorrected coma contribution. These contributions help to balance the low order aberrations between the groups G1 and G2, with the higher-order aspheric deformations on the mirrors themselves contributing to fine correction and aberration balance that allows the residual wavefront error (the departure of converging wavefront from an ideal reference sphere centered on the image field point) to remain exceedingly small. In fact, aberration correction and resulting aberration balance reduces the composite RMS wavefront error is only 0.011λ (0.15 nm), with simultaneous correction of the static distortion to less than 1.5 nm across the field.

As mentioned above, the first optical group G1 of the preferred system includes the first mirror M1 and the second mirror M2, and forms an intermediate image IMI of the object OB. The intermediate image IMI of the object OB is preferably formed with a magnification somewhere within a range around unity, e.g., between −0.8 and −1.2. For example, the magnification of the intermediate image IMI formed by the first optical group G1 of the object OB schematically illustrated at FIG. 1 is particularly approximately −1.02, which is a small expansion magnification. The system may be configured such that the first optical group G1 provides a small reduction magnification (e.g., between −0.8 and −1.0), a small expansion magnification (e.g., between −1.0 and −1.2), or substantially unity magnification.

The second optical group G2 includes the third through sixth mirrors M3–M6, respectively, and forms the image IM from the intermediate image IMI. The image IM is preferably formed with a magnification of the intermediate image IMI within a range around −0.25, e.g., between −0.15 and −0.35. For example, the magnification of the image IM formed by the second optical group G2 of the intermediate image IMI is particularly approximately −0.25. The overall magnification of the image IM formed by the system including the first and second optical groups G1 and G2 is therefore preferably around +0.25, or a 4× reduction as mentioned above. The substantial reduction of the image IM from the object OB is notably performed by the second optical group G2.

Since astigmatism is the dominant aberration to be corrected, the preferred embodiment utilizes a novel arrangement to influence the third-order (Seidel) astigmatism correction. The preferred embodiment is arranged so that the third order tangential astigmatism from the mirrors M3–M6 of the second optical group G2 is corrected (the Seidel sum approaches zero). To further minimize tangential astigmatism, the advantageous location of the aperture stop APE is selected so that the tangential astigmatism from the convex secondary mirror M2 is corrected (the Seidel contribution approaches zero). This construction enables the use of low departure/low gradient aspheres, especially on mirror M6 where aspheric departure from the best fit sphere across the clear aperture is around 4 µm in the system of the preferred embodiment as illustrated at Table 3. This sixth mirror M6 is the largest mirror in the six mirror system. The advantageously low aspheric departure of the sixth mirror M6 provides a far easier system to manufacture and test. The aspheric departure of the sixth mirror M6 according to the preferred embodiment may have an aspheric departure within a range below 6 µm, and preferably between 2 µm and 6 µm.

This optical projection system has further benefits in that the system of FIG. 1 may be scaled in either numerical aperture or field. For example, it is desirable to scale this concept to larger numerical aperture to improve the modulation in the aerial image thus allowing 30 nm resolution with a less aggressive k1-factor. The results of a simple scaling experiment demonstrate that this preferred embodiment easily supports such scaling to larger numerical apertures. Without making any modifications, an analysis of the composite root mean square (RMS) wavefront error was made at a numerical aperture of 0.25, which represents a 14% increase to the value shown in Table 3. The composite RMS wavefront error was found to be 0.033λ (0.44 nm), a level that supports lithographic quality imaging.

Figure 2:
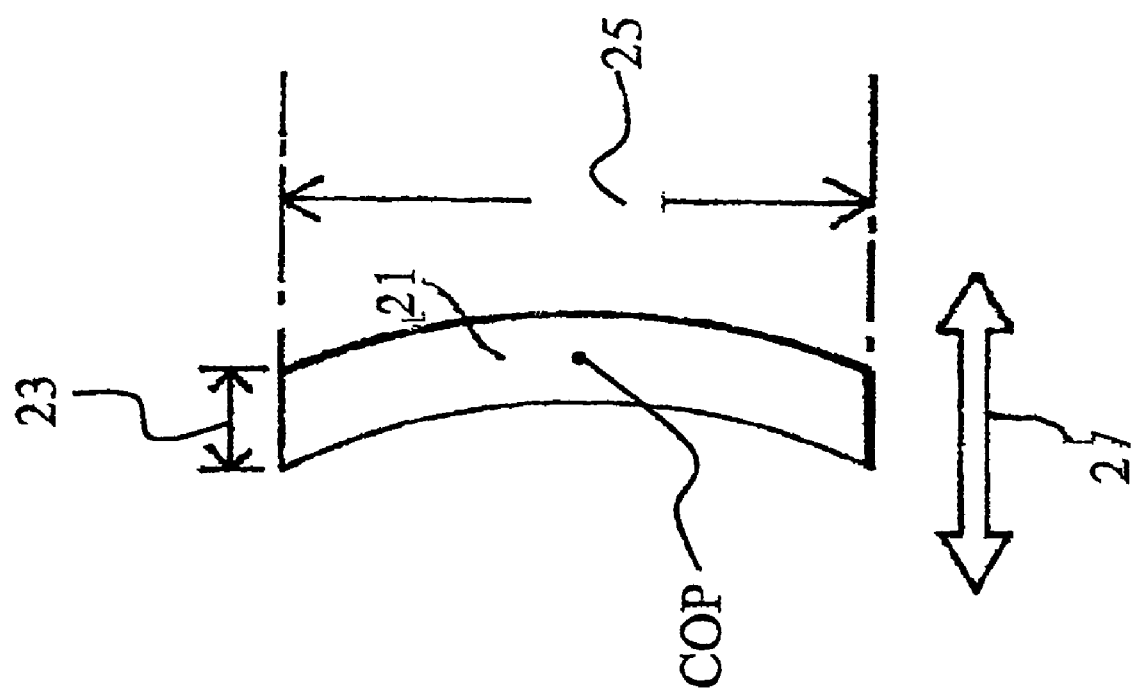
FIG. 2 schematically illustrates the geometry of the arcuate ring field according to the preferred embodiment at the object.

Referring to FIG. 2, it is desirable to increase the field of view in the scan direction to increase the number of wafers per hour (WPH) that the lithographic apparatus can process. The idea is that more area can be printed per unit time with a wider arcuate slit. The results of another simple scaling experiment demonstrate that this preferred embodiment easily supports increases in field width. Without making any modifications, an analysis of the composite RMS wavefront error was made over a 3 mm wide arcuate slit, which represents a 50% increase to the value shown in Table 3. The composite RMS wavefront error was found to be 0.021λ (0.28 nm), again a level that supports lithographic quality imaging.

The preferred embodiment depicted at FIG. 1 enables partial compensation for the degradation to the wavefront error due to the multilayer coatings. This partial phase compensation is particularly enabled by the design between mirror M2 and mirror M5. Multilayer phase effects that are due to large mean incidence angles on these surfaces are advantageously at least partially compensated in the system of the preferred embodiment. The preferred system is constructed to provide means for correcting these errors primarily using two constructions. First, the mean incidence angles of the ray bundle from the central field point COP at mirror M2 and mirror M5 are set to be nearly the same. The ray bundle is delimited in the tangential plane by the upper rim ray UR and the lower rim ray LR. The tangential plane is shown in FIG. 1 as the y-z-plane. For this preferred embodiment, the mean incidence angle at mirror M2 is around 14.6°, while the mean incidence angle at mirror M5 is around 11.0°. The angles do not have to be exactly the same, but their difference should be less than 5°, preferably less than 4°. Second, the difference in incidence angle variation across mirror M2 and mirror M5, as seen in the tangential plane, is minimized by varying the location of the secondary mirror M2 with respect to the aperture stop APE in combination with the location of the intermediate image IMI. For the preferred embodiment, the incidence angle variation in the tangential plane across mirror M2 is about 6°, while the incidence angle variation across mirror M5 is about 8.7°. The difference of the incidence angle variation should be less than 5°, preferably less than 4°. In the preferred embodiment the difference is 2.7° for an image-side numerical aperture NA of 0.22.

Referring to Table 4, the upper rim ray UR undergoes a higher phase change than the lower rim ray LR at mirror M2 due to the incidence angle of the upper rim ray UR (17.4°) being greater than that for the lower rim ray LR (11.4°). The difference between the incidence angles at M2 for UR and LR is then +6.0°. As the ray bundle propagates through the intermediate image IMI, the same upper ray UR that hits M2 above the lower ray LR, will strike M5 below where the lower ray LR strikes M5. The upper ray UR and lower ray LR change their relative positions along the y-axis after the formation of the intermediate image IMI. The upper ray UR, which strikes mirror M5 below the lower ray LR, will undergo a smaller phase change than the lower ray LR at mirror M5 due to the incidence angle of the upper ray UR (6.4°) being smaller than that for the lower ray LR (15.1°).

The difference between the incidence angles at M5 for UR and LR is then −8.7°. It is in this manner that a good measure of phase compensation between mirror M2 and mirror M5 is achieved, as Table 4 shows. A uniform Mo/Si multilayer coating (e.g., 40 bilayer pairs with bilayer thickness of 7.04 nm) may be typically applied to both mirror M2 and mirror M5. This Mo/Si multilayer induces a peak to valley phase error (which is identically equivalent to an optical path difference or wavefront error) of −0.406λ (5.44 nm) from M2, and a peak to valley phase error of +0.484λ (6.49 nm) from M5. The net phase change is thus reduced from ~0.500λ to only 0.078λ (1.05 nm) using this advantageous phase compensation technique in accord with the preferred embodiment. This residual phase error can be corrected with a modest amount of local optimization. This method represents a striking advantage over a system wherein wavefront errors are not compensated between mirror pairs and may instead add together to produce enhanced errors. The technique can be alternatively used to reduce the multiplayer-induced phase errors to around or below 0.125λ, to a level where modest local optimization can then be used to improve performance to lithographic levels.

As illustrated at FIG. 1, the system of the preferred embodiment includes the additional feature that the beam propagating between mirror M2 to mirror M3 and the beam propagating between mirror M4 and mirror M5 cross each other in the y-axis. In combination with the feature of the preferred embodiment that the intermediate image IMI is located between M2 and M3, this beam crossing feature works in conjunction with the compactness feature of the system, facilitates the handling of distortion and maintenance of low incidence angles, and provides substantial beam clearance. The beam crossing feature also works favorably with the high numerical aperture (e.g., above 0.18 and more preferably above around 0.20–0.25) of the system of the preferred embodiment.

The beam crossing occurs in such a way that the intermediate image IMI and the center of curvature of mirror M3 each lie to the left (in FIG. 1) of the vertex of M3. In a like manner, a real image would form after M4 if mirror M5 and mirror M6 were taken away. The center of curvature of M4 and this real image that would be formed with M5 and M6 taken out of the way would lie to the right of the vertex of M4. In this way, the mean incidence angles on both M3 and M4 are minimized.

The beam crossing arrangement permits the design to be scaled in either numerical aperture of field without "restrictions." In other words, there is plenty of beam clearance around mirrors M3 and M4. This also allows greater versatility in the design. This substantial beam clearance is facilitated by the beam crossing feature of the preferred embodiment, above that which would be expected in a system not having beam crossing.

The beam crossing of the preferred embodiment has the additional advantage that the optical distance between mirrors M3 and M4 and that between mirrors M4 and M5 may be increased, thus allowing the incidence angles to be reduced. Moreover and as mentioned briefly above, beam crossing facilitates the compactness feature of the preferred embodiment (i.e., preferably less than two meters and particularly around 1500 mm or less along the z-axis between the object and the image). Due to the space required for mirror mounts, and particularly that of mirror M4, the beam crossing feature of the preferred embodiment facilitates the realization of a compact, high numerical aperture system, and even more advantageously, a preferred system having significantly low incidence angles.

The optical design descriptions provided above for the preferred embodiment demonstrate an advantageous catoptric projection system concept for EUV lithography. While these embodiments have been particularly described for use in a 13.4 nm tool, the basic concept is not limited to use with lithographic exposure tools at this wavelength, either shorter or longer, providing a suitable coating material exists in the soft x-ray region of the electromagnetic spectrum.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof. For example, one skilled in the art may reconfigure the embodiments described herein to expand the field of view, increase the numerical aperture, or both, to achieved improvements in resolution or throughput.

TABLE 1

Optical prescription preferred embodiment

| Element number | Vertex radius of curvature | Thickness (mm) | Glass |
|---|---|---|---|
| Object OB | INFINITY | 723.7539 | |
| A(1) | −643.5439 | −192.7897 | REFL |
| Aperture Stop APE | INFINITY | −99.4340 | |
| A(2) | −2742.4833 | 363.1533 | REFL |
| Intermediate image IMI | INFINITY | 343.7066 | |
| A(3) | −2850.8680 | −644.4521 | REFL |
| A(4) | 1471.8440 | 971.0620 | REFL |
| A(5) | 252.1454 | −475.4847 | REFL |
| A(6) | 558.1165 | 510.4847 | REFL |
| Image IM | | | |

TABLE 2

Aspheric prescription

| Aspheric | K | A | B | C | D | E |
|---|---|---|---|---|---|---|
| A(1) | −1.0232 | 2.3506E−09 | −5.2889E−14 | 1.1199E−18 | −2.2037E−23 | 4.1964E−28 |
| A(2) | −207.7484 | 1.0280E−09 | 2.5446E−14 | 6.3412E−18 | −2.2982E−21 | 3.2649E−25 |
| A(3) | −3.9282 | 1.0123E−10 | 8.1343E−17 | −1.5369E−20 | 3.5192E−25 | −3.4955E−30 |
| A(4) | 0.1886 | 1.9835E−11 | −1.8278E−16 | 2.1374E−21 | −1.4503E−26 | 5.3855E−32 |
| A(5) | 0.9822 | −1.3413E−08 | 9.1993E−13 | −2.2661E−17 | −5.9605E−22 | 2.6224E−25 |
| A(6) | 0.0814 | −2.4749E−11 | −5.9262E−17 | −1.2870E−23 | −1.4070E−26 | 6.3467E−31 |

TABLE 3

Performance summary preferred embodiment

| Metric | Performance |
|---|---|
| Wavelength | 13.4 nm |
| Numerical aperture (image) | 0.22 |
| Ringfield format (image) | |
| i. Radius | 30.0 mm |
| ii. Width | 2.0 mm |
| iii. Chord | 26.0 mm |

TABLE 3-continued

Performance summary preferred embodiment

| Metric | Performance |
|---|---|
| Reduction ratio (nominal) | 4:1 |
| Overall length (mm) | 1500 mm |
| RMS wavefront error (waves @ λ = 13.4 nm) | |
| i. Composite | 0.011λ |
| ii. Variation | 0.007λ–0.014λ |
| Chief ray distortion | <1.5 nm |
| Exit pupil location | Infinity |
| Max. aspheric departure across instantaneous clear aperture (ICA) | |
| i. M1 | 36.0 μm |
| ii. M2 | 2.5 μm |
| iii. M3 | 9.4 μm |
| iv. M4 | 14.0 μm |
| v. M5 | 2.7 μm |
| vi. M6 | 4.0 μm |

TABLE 4 phase compensation

| Mirror | AOI upper rim ray (UR) | Mean AOI | AOI lower rim ray (LR) | AOI variation across | Phase error (waves, λ = 13.4 nm) |
|---|---|---|---|---|---|
| M2 | 17.4° | 14.6° | 11.4° | 6.0° | −0.406λ |
| M5 | 6.4° | 11.0° | 15.1° | −8.7° | +0.484λ |
| | | | | Sum | +0.078λ |

Figure 3:
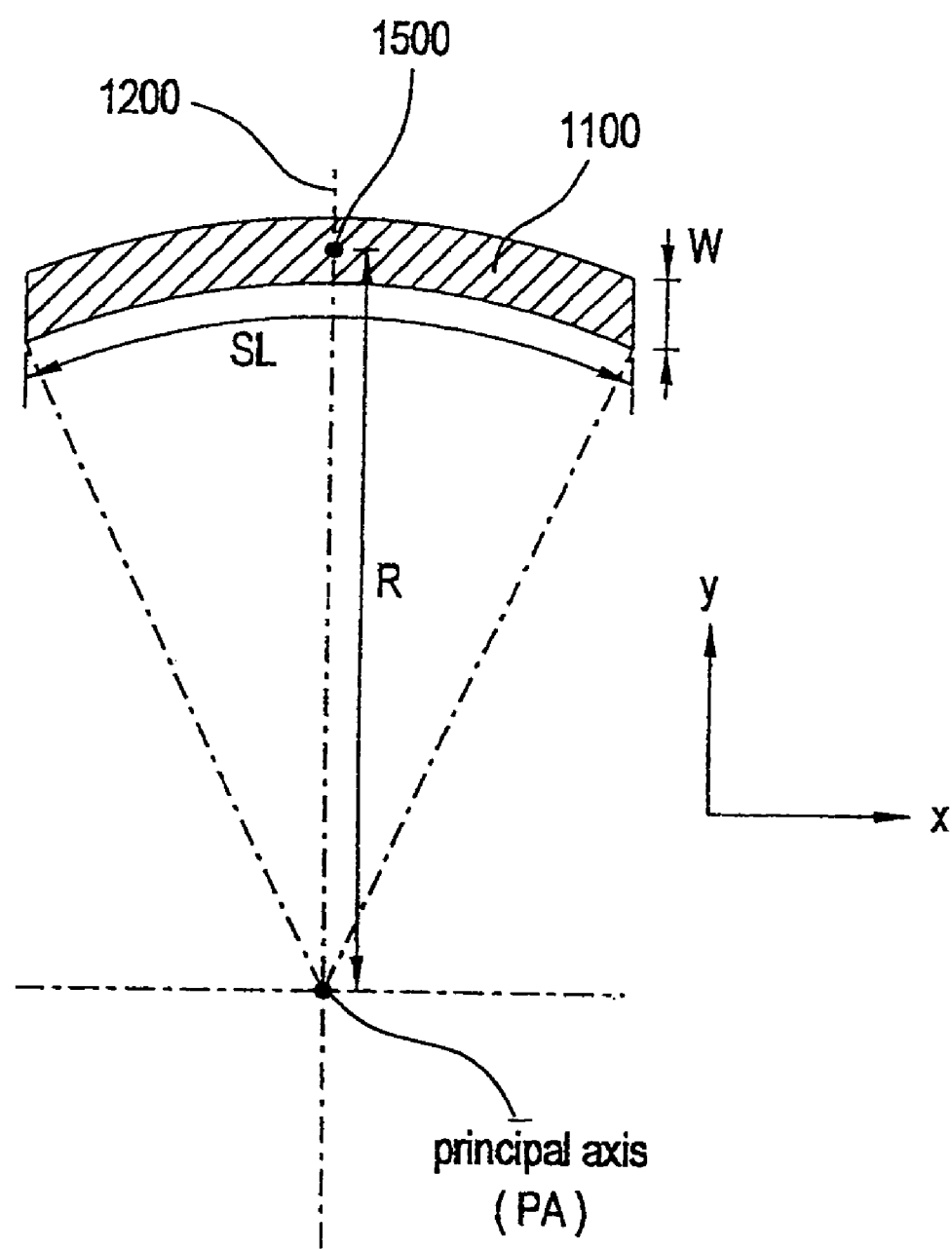
FIG. 3 shows the ring field in the object plane of the objective

In FIG. 3 the object field 1100 of a projection exposure apparatus in the object plane of the projection objective according to the invention is shown. The object plane is imaged by means of the projection objective in an image plane, in which a light sensitive object, for example a wafer with a light sensitive material is arranged. The image field in the image plane has the same shape as the object field. The object- or the image field 1100 has the configuration of a segment of a ring field. The ring field has an axis of symmetry 1200.

In addition the axis extending the object plane, i.e., the x-axis and the y-axis are depicted. As can be seen from FIG. 3, the axis of symmetry 1200 of the ring field runs in the direction of the y-axis. At the same time the y-axis coincides with the scanning direction of an projection exposure apparatus, which is designed as a ring field scanner. The x-direction is thus the direction that stands perpendicular to the scanning direction, within the object plane. The ring field has a so called ring field radius R, which is defined by the distance of the central field point 1500 of the image field from the principal axis (PA) of the projection objective. The arc-shaped field in the object plane as well as in the image plane has a arc shaped field width W, which is the extension of the field in scanning or in y-direction and a secant length SL.

Figure 6:
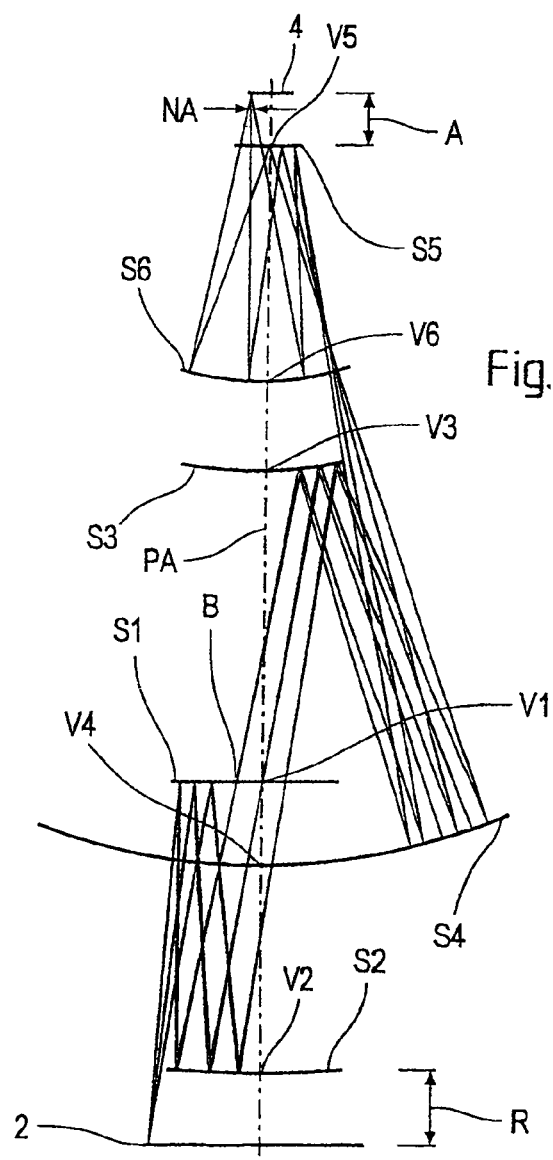
FIG. 6 shows a second embodiment with an aperture stop between the second and third mirror at the first mirror.
Figure 7:
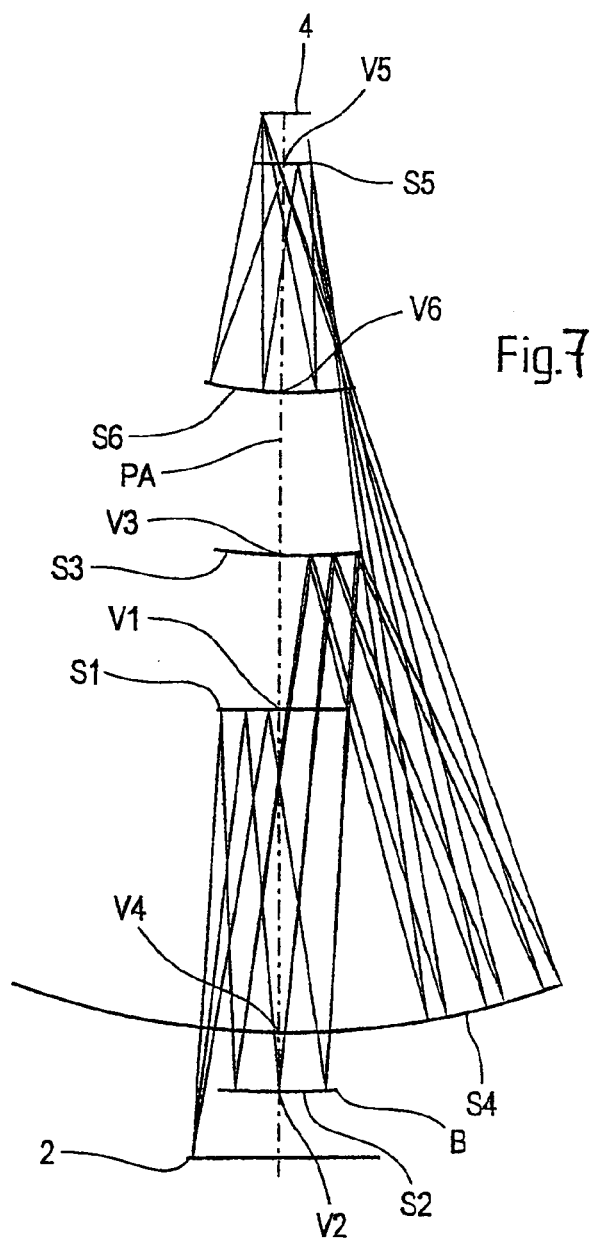
FIG. 7 shows a third embodiment with an aperture stop on the second mirror and a working distance of 59 mm.

In FIGS. 4, 6 and 7, arrangements of the six-mirror projection objectives are shown. Each embodiment has a free working distance that corresponds at least to the used diameter of the physical mirror surface or mirror segment next to the wafer. In contrast, FIG. 5 shows a prior art system for use with wavelengths >100 nm, such as the system of U.S. Pat. No. 5,686,728. In all embodiments shown in FIGS. 4, 6 and 7, the same reference numbers will be used for the same components and the following nomenclature will be employed:

first mirror (S1), second mirror (S2), third mirror (S3), fourth mirror (S4), fifth mirror (S5), and sixth mirror (S6)

In particular, FIG. 4 shows a six-mirror projection objective with a ray path from the object plane 2, i.e. reticle plane to the image plane 4, i.e. wafer plane. The embodiment includes a field mirror S1, which forms a virtual image of an object with an imaging ratio β>0. A three-mirror system formed from S2, S3 and S4 is also provided and produces a real, reduced image of the virtual image as the intermediate image, Z. Lastly, a two-mirror system S5, S6, images the intermediate image Z in the wafer plane 4 while maintaining the requirements of telecentricity. The aberrations of the three-mirror and two-mirror subsystems are balanced against one another so that the total system has a high optical quality sufficient for integrated circuit fabrication applications.

The physical aperture stop B is arranged between the second mirror S2 and the third mirror S3. And, as is clear from FIG. 4, the aperture stop is accessible in the ray path between the second mirror S2 and the third mirror S3. Furthermore, the distance between the vertex V5 of the surface of the mirror next to the wafer, i.e., the surface of the fifth mirror S5 in the present embodiment, and the image plane is greater than the used diameter of the physical mirror surface of mirror S5. The used diameter of a physical mirror surface is explained in more detail in the description of FIGS. 10A and 10B. In other words, the following condition is fulfilled:

physical distance from the vertex V5 of the surface of mirror S5 to the image plane 4>used diameter of mirror S5.

Other distance requirements are also possible and may be used, such as the physical distance is (1) greater than the sum of one-third of the used diameter of the mirror next to the wafer, S5, and 20 mm, or (2) greater than 50 mm. In the preferred embodiment, the physical distance is 60 mm.

Such a physical distance guarantees a sufficiently free working distance A, and allows the use of optical components compatible for use with wavelengths <100 nm, and preferably wavelengths of 11 to 13 nm. Optical components in this range include, for example, Mo/Si or Mo/Be multilayer systems, where the typical multilayer systems for λ=13 nm is Mo/Si layer pairs and for λ=11 nm, is Mo/Be systems, both of approximately 70 layer pairs. Reflectivities attainable in such systems are approximately 70%. In the multilayer layer systems, layer stresses of above 350 MPa may occur. Stresses of such values may induce surface deformation, especially in the edge regions of the mirror.

The systems according to the invention, as they are shown, for example, in FIG. 4, have:

$$RES = k_1 \lambda / NA.$$

This results in a nominal resolution of at least 50 nm and 35 nm at a minimum numerical aperture of NA=0.2 for $k_1$=0.77 and λ=13 nm, and for $k_1$=0.64 and λ=11 nm, respectively, where $k_1$ is a parameter specific for the lithographic process.

Furthermore, the light path for a bundle of light rays running from the object plane to the image plane of the objective shown in FIG. 6 is obscuration-free. For example, in order to provide image formats of 26×34 mm² or 26×52 mm², the projection objectives according to the invention are preferably used in an arc-shaped field scan projection exposure apparatus, wherein the secant length of the scan slit is at least 26 mm.

Numerous masks can be used in the projection exposure apparatus. The masks or reticle are arranged in the object plane of the projection objective. The masks include transmission masks, stencil masks and reflection masks. The projection objective, which is telecentric on the image side, i.e. in the image plane, can be telecentric or non-telecentric on the object side, i.e. in the object plane depending on which mask is used. For example, if the bundle of light rays is telecentric on the object-side when using a reflection mask a transmission-reducing beam splitter must be employed. If the bundle of light rays is non-telecentric on the object-side, unevennesses of the mask leads to dimensional errors in the image. Therefore, the angle of incidence of the chief ray of the bundle of light rays through the central field point 1500 in the object plane is preferably below 10°, so that the requirements for reticle evenness lies in an achievable range. Moreover, the system of FIG. 4 which is telecentric on the image side has an image-side error of telecentry at the wafer level of 1 mrad for a image side numerical aperture of 0.2.

Due to the high image-side telecentricity, the entrance pupil of the last mirror S6 is at or near the focal plane of this mirror. Therefore, in systems with an intermediate image as described before, the aperture, B, is in the front, low-aperture objective part preferably in the light path between the first and third mirror S1, S3. Thus the pupil plane conjugated with the aperture stop will be imaged in the focal plane of the last mirror.

All mirrors S1–S6 of FIG. 4 are designed to be aspherical, with a maximum asphericity of approximately 7.3 μm. The low asphericity of the embodiment shown in FIG. 4 is advantageous from a manufacturing point of view, since the technological difficulties in processing the surfaces of the multilayer mirrors increases proportionally with aspherical deviation and gradient of the asphere.

The highest angle of incidence of a ray impinging a mirror surface in the six-mirror objective shown in FIG. 4 occur on the fifth mirror S5 and is approximately 18.4°. The maximum variation of the angles of incidence of the rays within a bundle of light rays impinging onto a mirror surface occurs on mirror surface of mirror S5 and is approximately 14.7°. The wavefront error at λ=13 nm is better than 0.032 λ; the centroid distortion of the point spread function is <3 mm; and the static, dimension-corrected distortion lies at 4 nm.

A freely accessible aperture stop between the second and third mirror as well as no vignetting of the bundle of light rays running from S3 to S4 by the aperture stop is achieved with small angles of incidence of the rays impinging onto the mirror surfaces when the following distance conditions are fulfilled:

0.5<S1S3/S1S2<2 and 0.5<S2 aperture/(S3 aperture)<2.

Here, the abbreviation S1S3 means the mechanical distance or physical distance between the vertices V1 and V3 of the surface of the mirrors S1 and S3. And, "S2 aperture" means the mechanical distance between the vertex V2 of the surface of mirror S2 and the aperture.

Furthermore, in order to reduce the angles of incidence on the mirrors in any of the embodiments of FIGS. 4, 6, and 7, the distance from the object plane, where e.g. the reticle is situated to the vertex of the surface of the mirror S1 is made smaller than the mechanical distance from the vertex of the surface of mirror S2 to the vertex of the surface of mirror S3, i.e., the following applies:

reticle S1<S2S3.

To ensure a sufficient free working distance A not only on the image side but also on the object side the reticle is situated sufficiently far in front of the first mirror next to the object plane, which is in the present case the surface of the second mirror S2. In the present case, for example, the physical distance between the reticle and the vertex V2 of the surface of mirror S2 is 80 mm.

Furthermore, in the embodiments of FIGS. 4 and 6 to 8, the physical distance between the mirrors S3 and S6 is chosen that mirrors of sufficient thickness can be used. Thicker mirrors have sufficient strength and stability properties that can withstand the high layer tensions described above. In these systems, the following relationship is preferred:

0.3(used diameter S3+used diameter S6)<S3S6.

Here S3S6 denotes the physical distance between the vertex V3 of the surface of mirror S3 and the vertex V6 of the surface of the mirror S6.

In the following table 5, the parameters of the system represented in FIG. 4 are exemplarily shown in Code V(™) nomenclature. The objective is a 5× system with a 26×2 mm² arc-shaped field in the image plane, wherein 26 mm is the secant length of the arc-shaped field and 2 mm is the width W of the arc shaped field.

Furthermore the numerical aperture is 0.2 on the image side. The mean image side radius of the system is approximately 26 mm.

TABLE 5

| element No. | radius | Thickness | diameter | Type |
|---|---|---|---|---|
| Object | INF | 80.9127 | 258.1723 | |
| | | 413.0257 | | |
| S1 | A(1) | −88.8251 | 197.5712 | REFL |
| | | −324.2006 | 195.6194 | |
| | | 0.0000 | 188.6170 | |
| S2 | A(2) | 324.2006 | 188.7078 | REFL |
| | | aperture | 67.1796 | |
| | | 423.6214 | 183.2180 | |
| | | 0.0000 | | |
| S3 | A(3) | −423.6214 | 184.7062 | REFL |
| | | −74.9270 | 519.0546 | |
| S4 | A(4) | 498.5484 | 541.0453 | REFL |
| | | 109.8242 | 248.6244 | |
| | | 281.5288 | 177.5488 | |
| S5 | A(5) | −281.5288 | 65.0842 | REFL |
| S6 | A(6) | 281.5288 | 187.9549 | REFL |
| | | | 78.3999 | |
| Image | image width | 59.9202 | 53.9889 | | aspherical constants:
$$Z = (CURV) Y^2/[1 + (1 − (1 + K)(CURV)^2 Y^2)^{1/2}] + (A)Y^4 + (B)Y^6 + (C)Y^8 + (D)Y^{10}$$

| asphere | CURV | K | A | B | C | D |
|---|---|---|---|---|---|---|
| A(1) | 0.00031800 | −27.686599 | 0.00000E+00 | 1.32694E−15 | 2.00546E−20 | −8.49471E−25 |
| A(2) | 0.00094928 | −3.998204 | 0.00000E+00 | 4.03849E−15 | −6.15047E−20 | 2.73303E−25 |
| A(3) | 0.00126752 | 0.424198 | 0.00000E+00 | 1.58766E−15 | −8.27965E−20 | 2.80328E−24 |
| A(4) | 0.00123850 | 0.023155 | 0.00000E+00 | 2.46048E−17 | −1.08266E−22 | 3.75259E−28 |
| A(5) | 0.00329892 | 2.902916 | 0.00000E+00 | 1.55628E−12 | −6.71619E−17 | −5.30379E−21 |
| A(6) | 0.00277563 | 0.072942 | 0.00000E+00 | 2.96285E−16 | 3.99125E−21 | 4.55007E−26 |

Reference wavelength = 13 nm

FIG. 5 shows an arrangement of a projection objective for microlithography with a wavelength of λ<100 nm according to U.S. Pat. No. 5,686,728. Components substantially similar to those of FIG. 4 are provided with the same reference numbers. As is clear, the physical distance between the vertex V5 of the surface of the mirror next to the image plane S5 and the image plane, where the wafer is situated is significantly smaller than the used diameter of the fifth mirror S5, lying mainly in the range of approximately 20 mm. This leads to strength and stability problems for the optics in the EUV region because of the extreme tensions in the layers. Furthermore, the system has a asphericities of ±50 µm and a maximum angle of incidence of 38°.

FIG. 6 is an alternative embodiment of a six-mirror system in which the aperture stop is situated on the first mirror. The same components as in FIG. 4 again receive the same reference number in FIG. 6. The free working distance A to the wafer is 60 mm in this embodiment, as it was in the embodiment of FIG. 4 and thus it is greater than the used diameter of the mirror next to the wafer, S5. Similarly, as with FIG. 4, the physical distance between the vertex V2 of the surface of mirror S2 and the vertex V3 of the surface of mirror S3 was increased significantly in comparison to that of U.S. Pat. No. 5,686,728, so that large angles of incidence can be avoided in the system.

One difference to the objective of FIG. 4, is that in FIG. 6 the aperture stop B is placed on the first mirror S1. As a result of this position, a reduction in vignetting from the light reflected on S2 is possible, whereas with the physical aperture stop positioned between S1 and S2 light of the bundle of light rays running thorough the objective could pass above the aperture stop which is designed as a narrow ring. In the embodiment shown in FIG. 6, the aperture can be either an opening in the S1 mirror or an aperture disposed behind S1 close to this mirror.

Another advantage of this embodiment is the spherical design of mirror S4, which presents advantages especially from the point of view of manufacturing, because mirror S4 is the largest mirror of the system. With such a design, the asphericity in the used range is 10.5 µm. The largest angle of incidence occurs on mirror S5 and is approximately 18.6°. The wavefront error of the arrangement is 0.032 λ, within a 1.7 mm wide arc-shaped field at λ=13 nm. Furthermore, if the mirror S4 is designed to be slightly aspherical with 0.4 µm, then the wavefront error can be kept to 0.031 λ within a 1.8 mm wide arc-shaped field at λ=13 nm. Efficient masking of the undesirable light is obtained not only when the aperture stop is formed directly on mirror S1, but also when it is arranged behind, i.e., after, mirror S1. Preferably, the aperture stop is positioned such that the following relationship is obtained:

$$S2S1 \leq 0.9 \times S2 \text{ aperture.}$$

S2S1 denotes the mechanical distance of the vertex V2 of the surface of mirror S2 and the vertex V1 of the surface of the mirror S1.

Table 6 shows the constructional data of the 5× objective according to FIG. 6 in Code V(™) nomenclature, where the fourth mirror S4 is spherical. The mean radius of the 26×1.7 mm² image field is approximately 26 mm.

TABLE 6

| Element No. | Radius | Thickness | diameter | type |
|---|---|---|---|---|
| Object | INF | 85.2401 | 256.1389 | |
| | | 358.4668 | | |
| S1 | A(1) | 0.0024 | 203.8941 | REFL |
| | | −358.4691 | 203.8845 | |
| | | 0.0000 | 201.9677 | |
| S2 | A(2) | 358.4691 | 201.9942 | REFL |
| | | aperture | 60.7572 | |
| | | 390.5456 | 187.2498 | |
| | | 0.0000 | | |
| S3 | A(3) | −390.5456 | 188.9474 | REFL |
| | | −104.1273 | 505.8686 | |
| S4 | A(4) | 494.6729 | 550.3686 | REFL |
| | | 114.3062 | 256.9217 | |
| | | 281.6969 | 181.7337 | |
| S5 | A(5) | −281.6969 | 64.4286 | REFL |
| S6 | A(6) | 281.6969 | 187.8549 | REFL |
| | | | 78.1545 | |
| Image | image width | 60.0041 | 53.6996 | | aspherical constants:
$$Z = (CURV) Y^2/[1 + (1 − (1 + K) (CURV)^2 Y^2)^{1/2}] + (A)Y^4 + (B)Y^6 + (C)Y^8 + (D)Y^{10}$$

| asphere | CURV | K | A | B | C | D |
|---|---|---|---|---|---|---|
| A(1) | 0.00035280 | −58.238840 | 0.00000E+00 | 2.14093E−15 | 2.29498E−20 | 0.00000E+00 |
| A(2) | 0.00097971 | −4.160335 | 0.00000E+00 | 1.54696E−15 | 8.15622E−21 | 0.00000E+00 |
| A(3) | 0.00117863 | −2.136423 | 0.00000E+00 | −1.78563E−16 | 3.45455E−20 | 0.00000E+00 |
| A(4) | 0.00124362 | 0.000000 | 0.00000E+00 | 0.00000E+00 | 0.00000E+00 | 0.00000E+00 |
| A(5) | 0.00338832 | 2.909987 | 0.00000E+00 | 7.90123E−13 | 7.04899E−17 | 0.00000E+00 |
| A(6) | 0.00278660 | 0.062534 | 0.00000E+00 | 2.79526E−16 | 7.00741E−21 | 0.00000E+00 |

Reference wavelength = 13 nm

Another embodiment is shown in FIG. 7, where again the same reference numbers are used for the same components as in the previous figures. Here, the aperture stop B is placed optically and physically on the secondary mirror or second mirror S2. The ability to place the aperture stop on S2 makes manufacturing easier. Therefore this arrangement is advantageous. The system of FIG. 7 is a 4× reduction system with a wavefront error of 0.021 λ within a 2 mm wide image side arc-shaped field at λ=13 nm. The maximum asphericity in the used range lies at 11.2 µm, and the largest angle of incidence, which occurs at S5, is approximately 18.3°. The ring field radius R as defined in FIG. 3 of the arc-shaped field in the image plane is approximately 26 mm, as with the previous two embodiments. Furthermore, the distance between the image plane and the vertex V5 of the surface of the mirror next to the image plane, S5, is greater than the used diameter of the mirror next to the wafer, S5, and lies at around 59 mm in this embodiment.

Table 7 shows the optical parameters of the embodiment of FIG. 7 in Code V(™) nomenclature.

TABLE 7

| element No. | Radius | thickness | diameter | Type |
|---|---|---|---|---|
| Object | INF | 84.0595 | 205.6642 | |
| | | 473.5521 | | |
| S1 | A(1) | −145.8261 | 147.3830 | REFL |
| | | −327.7260 | 136.4700 | |
| | | aperture | 112.0176 | |
| | | 0.0000 | | |
| S2 | A(2) | 473.5521 | 112.1228 | REFL |
| | | 190.4830 | 163.5236 | |
| | | 0.0000 | 184.4783 | |
| S3 | A(3) | −190.4830 | 185.3828 | REFL |
| | | −399.1713 | 358.6720 | |
| S4 | A(4) | 589.6560 | 654.5228 | REFL |
| | | 207.5220 | 310.1977 | |
| | | 276.2668 | 175.3066 | |
| S5 | A(5) | −276.2668 | 65.2138 | REFL |
| S6 | A(6) | 276.2668 | 182.8159 | REFL |
| | | | 77.5085 | |
| image | image width | 59.0000 | 53.9968 | | aspherical constants:
$$Z = (CURV)\, Y^2/[1 + (1 - (1 + K)\,(CURV)^2 Y^2)^{1/2}] + (A)Y^4 + (B)Y^6 + (C)Y^8 + (D)Y^{10}$$

| asphere | CURV | K | A | B | C | D |
|---|---|---|---|---|---|---|
| A(1) | 0.00015851 | 441.008070 | 0.00000E+00 | −3.49916E−16 | 1.27478E−19 | −3.37021E−25 |
| A(2) | 0.00089932 | −5.032907 | 0.00000E+00 | −6.95852E−15 | −7.53236E−20 | −2.74751E−24 |
| A(3) | 0.00188578 | 0.913039 | 0.00000E+00 | −1.60100E−15 | −9.53850E−20 | 1.30729E−26 |
| A(4) | 0.00108147 | 0.038602 | 0.00000E+00 | 2.48925E−18 | −5.29046E−24 | −4.37117E−31 |
| A(5) | 0.00269068 | 7.253316 | 0.00000E+00 | −5.70008E−13 | −9.32236E−17 | −6.09046E−21 |
| A(6) | 0.00281036 | 0.150957 | 0.00000E+00 | 1.30822E−15 | 1.86627E−20 | 5.08158E−25 |

Reference wavelength = 13 nm

Figure 8:
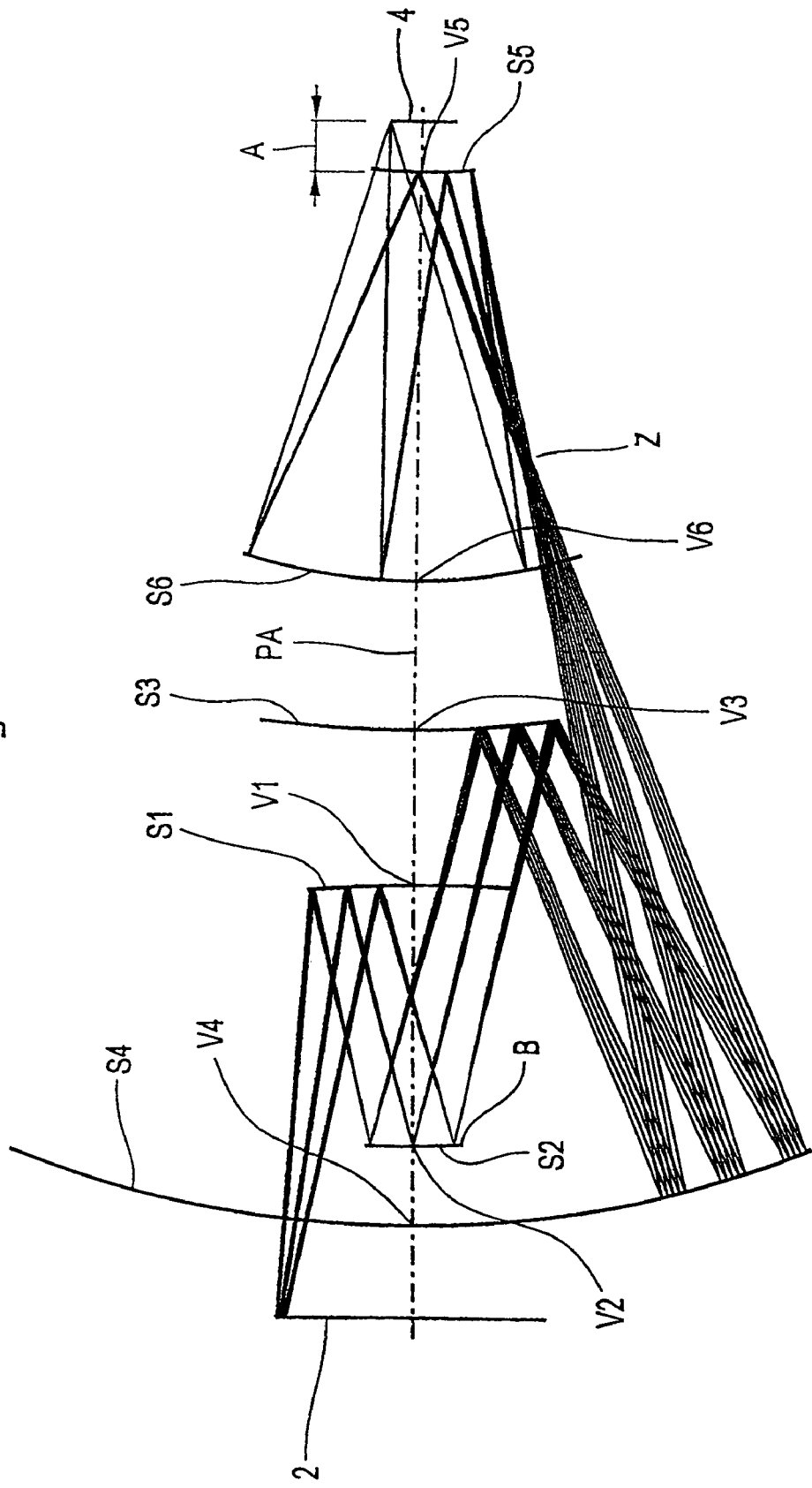
FIG. 8 shows a fourth embodiment with an intermediate image, a image side numerical aperture NA of 0.28 as well as a free working distance on the image-side which is at least the sum of one-third of the useful diameter of the mirror nearest to the wafer and a length which lies between 20 and 30 mm.

FIG. 8 shows an embodiment of the invention which includes a field mirror S1, a first subsystem with the second to fourth mirror S2–S4 and a second subsystem with the fifth and sixth mirror, S5, S6. The field mirror S1 with imaging ratio, β, β>0 produces a virtual image of the object in the object plane 2. The virtual image is then imaged by the first subsystem consisting of the second, third and fourth mirrors, S2, S3, S4, which has β<0, producing a real intermediate image Z in a plane conjugate to the object plane 2. The real intermediate image Z is imaged as a real image into image plane 4 by the second subsystem which consists of the fifth and sixth mirrors, S5, S6. The image side numerical aperture of the system is NA=0.28. The optical free working distance A between the vertex of the surface of the last mirror S5 and the image plane 4 corresponds to at least the sum of one-third of the used diameter of the mirror nearest to the image plane and a length which lies between 20 and 30 mm. The aperture stop B is situated on the second mirror S2.

Table 8 shows the optical parameters of the embodiment of FIG. 8 in Code V(™) nomenclature.

TABLE 8

| element No. | Radius | thickness | Diameter | Type |
|---|---|---|---|---|
| Object | INF | 151.2625 | 194.7605 | |
| | | 229.0820 | | |
| S1 | A(1) | −39.4068 | 162.9862 | REFL |
| | | −189.6752 | 147.1426 | |
| | | aperture | 65.0637 | |
| | | 0.0000 | | |
| S2 | A(2) | 229.0820 | 65.1650 | REFL |
| | | 137.5708 | 168.3504 | |
| | | 0.0000 | 230.5128 | |
| S3 | A(3) | −137.5708 | 234.0072 | REFL |
| | | −300.3445 | 386.2567 | |
| S4 | A(4) | 437.9153 | 630.7784 | REFL |
| | | 133.0981 | 343.1578 | |
| | | 353.0840 | 257.0225 | |
| S5 | A(5) | −353.0840 | 79.9521 | REFL |
| S6 | A(6) | 353.0840 | 264.2853 | REFL |
| | | | 78.6376 | |
| image | image width | 44.0000 | 54.0051 | |

TABLE 8-continued aspherical constants:
$$Z = (CURV) Y^2/[1 + (1 - (1 + K) (CURV)^2 Y^2)^{1/2}] + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| asphere | CURV | K E | A F | B G | C H | D J |
|---|---|---|---|---|---|---|
| A(1) | −0.00080028 | 0.000000 | −3.35378E−09 | 5.36841E−14 | −7.86902E−19 | −5.07886E−24 |
|  |  | 0.00000E+00 | 0.00000E+60 | 0.00000E+00 | 0.00000E+00 | 0.00000E+00 |
| A(2) | 0.00040002 | 0.000000 | 1.68187E−08 | 2.05570E−12 | 2.42710E−16 | 5.69764E−20 |
|  |  | 0.00000E+00 | 0.00000E+00 | 0.00000E+00 | 0.00000E+00 | 0.00000E+00 |
| A(3) | 0.00113964 | −2.760663 | 0.00000E+00 | −3.55779E−15 | 1.03881E−19 | −3.64996E−24 |
|  |  | 0.00000E+00 | 0.00000E+00 | 0.00000E+00 | 0.00000E+00 | 0.00000E+00 |
| A(4) | 0.00128753 | 0.019273 | 0.00000E+00 | 5.82746E−18 | −1.77496E−22 | 1.64954E−27 |
|  |  | −6.20361E−33 | 0.00000E+00 | 0.00000E+00 | 0.00000E+00 | 0.00000E+00 |
| A(5) | 0.00373007 | 11.6888968 | 0.00000E+00 | −5.53902E−12 | −4.32712E−16 | −1.54425E−19 |
|  |  | 0.00000E+00 | 0.00000E+00 | 0.00000E+00 | 0.00000E+00 | 0.00000E+00 |
| A(6) | 0.00240387 | −0.002567 | 0.00000E+00 | −6.78955E−16 | −8.39621E−21 | −2.95854E−25 |
|  |  | 0.00000E+00 | 0.00000E+00 | 0.00000E+00 | 0.00000E+00 | 0.00000E+00 |

Reference wavelength = 13 nm

Figure 9:
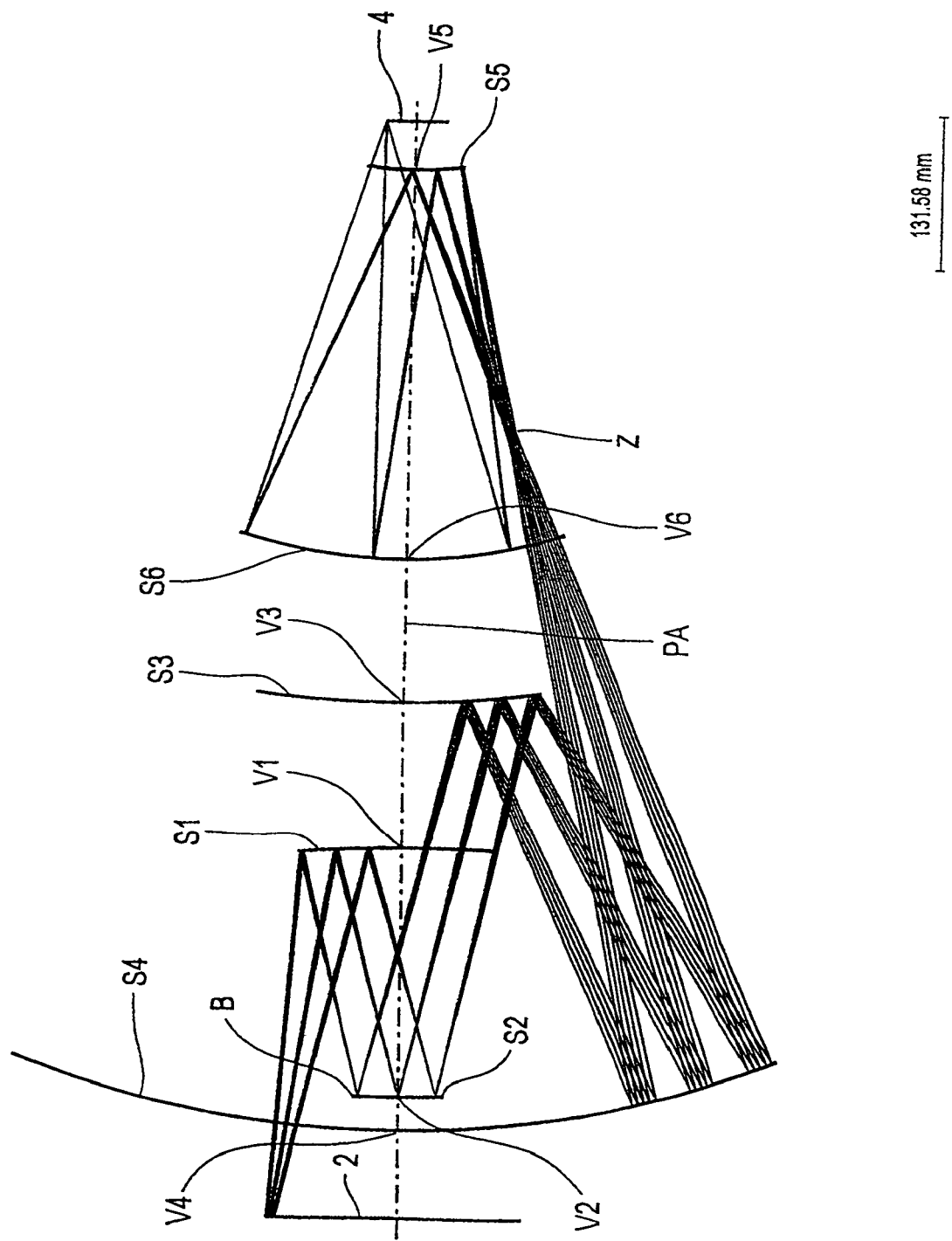
FIG. 9 shows a fifth embodiment of a system with an intermediate image and a image side numerical aperture NA of 0.30.

FIG. 9 shows a similar, yet alternative, embodiment to that of FIG. 8 with a six-mirror objective with field mirror S1 as well as first and second subsystems as shown in FIG. 8. The embodiment shown in FIG. 9 comprises as the embodiment in FIG. 8 an intermediate image Z. Furthermore the aperture B is formed on the second mirror S2 similar and the numerical aperture on the image side is NA=0.30. The optical parameters of this alternative embodiment are shown in Table 9 in Code V(™) nomenclature.

TABLE 9

| element No. | radius | thickness | Diameter | type |
|---|---|---|---|---|
| object | INF | 103.2808 | 197.1874 |  |
|  |  | 219.3042 |  |  |
| S1 | A(1) | −39.2890 | 157.6222 | REFL |
|  |  | −180.0152 | 142.1492 |  |
|  |  | aperture | 67.2659 |  |
|  |  | 0.0000 |  |  |
| S2 | A(2) | 219.3042 | 67.4347 | REFL |
|  |  | 131.2051 | 167.6895 |  |
|  |  | 0.0000 | 228.0182 |  |
| S3 | A(3) | −131.2051 | 232.3162 | REFL |
|  |  | −247.5850 | 401.4441 |  |
| S4 | A(4) | 378.7901 | 613.5493 | REFL |
|  |  | 134.4001 | 355.7774 |  |
|  |  | 348.5086 | 268.3735 |  |
| S5 | A(5) | −348.5086 | 81.5255 | REFL |
| S6 | A(6) | 348.5086 | 269.2435 | REFL |
|  |  |  | 75.4983 |  |
| image | image width | 36.1195 | 53.9942 |  | aspherical constants:
$$Z = (CURV) Y^2/[1 + (1 - (1 + K) (CURV)^2 Y^2)^{1/2}] + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| asphere | CURV | K E | A F | B G | C H | D J |
|---|---|---|---|---|---|---|
| A(1) | −0.00061615 | 0.000000 | −5.19402E−09 | 1.09614E−13 | −3.44621E−18 | 1.58573E−22 |
|  |  | −7.07209E−27 | 0.00000E+00 | 0.00000E+00 | 0.00000E+00 | 0.00000E+00 |
| A(2) | 0.00066911 | 0.000000 | 1.69112E−08 | 2.39908E−12 | 2.89763E−16 | 1.00572E−19 |
|  |  | 1.84514E−29 | 0.00000E+00 | 0.00000E+00 | 0.00000E+00 | 0.00000E+00 |
| A(3) | 0.00140031 | 0.000000 | −8.71271E−10 | −1.47622E−15 | −3.40869E−20 | 4.32196E−24 |
|  |  | −2.23484E−28 | 0.00000E+00 | 0.00000E+00 | 0.00000E+00 | 0.00000E+00 |
| A(4) | 0.00143731 | 0.000000 | 2.18165E+12 | 2.65405E−17 | −2.01757E−22 | 1.14856E−28 |
|  |  | 1.49857E−32 | −8.61043E−38 | 0.00000E+00 | 0.00000E+00 | 0.00000E+00 |
| A(5) | 0.00378996 | 0.000000 | 8.54406E−08 | 2.25929E−12 | 3.36372E−16 | 1.92565E−20 |
|  |  | 5.75469E−24 | 0.00000E+00 | 0.00000E+00 | 0.00000E+00 | 0.00000E+00 |
| A(6) | 0.00246680 | 0.000000 | −3.61754E−12 | −8.29704E−16 | −1.53440E−20 | −2.24433E−25 |
|  |  | 5.91279E−30 | 0.00000E+00 | 0.00000E+00 | 0.00000E+00 | 0.00000E+00 |

Reference wavelength = 13 nm

Figure 10A:
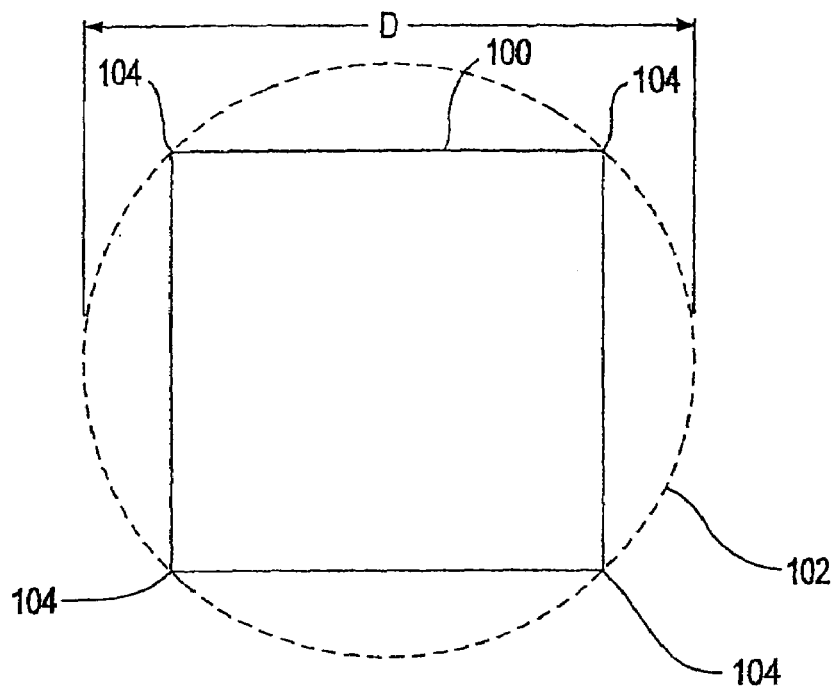
FIGS. 10A and 10B show the used diameter for different physical mirror surfaces or used areas of a mirror
Figure 10B:
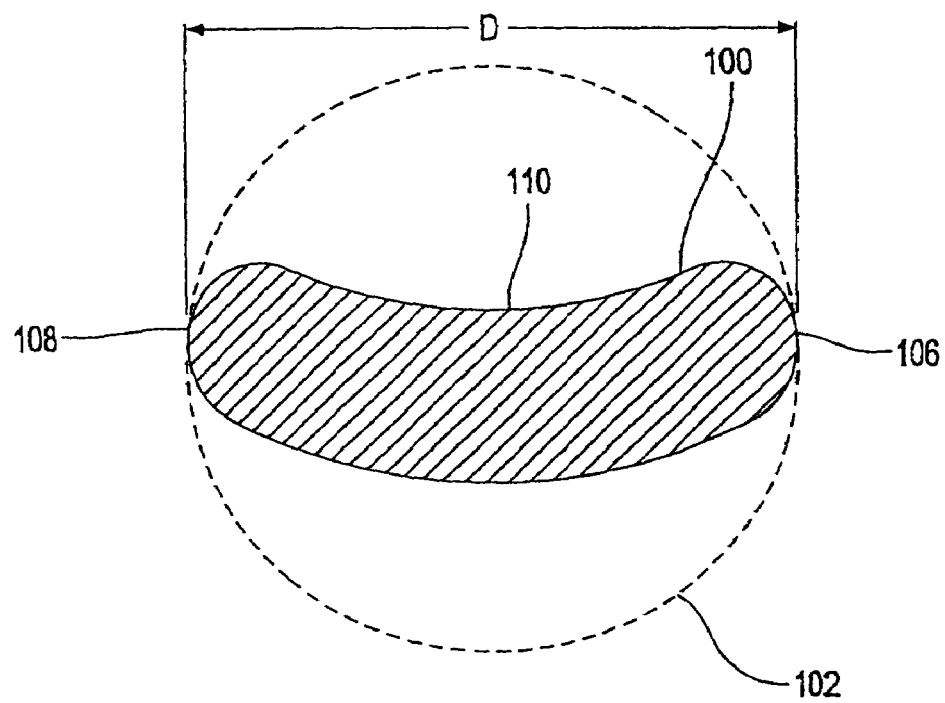

FIGS. 10A and 10B define the used diameter D as used in the description of the above embodiments. As a first example, the illuminated field 100 on a mirror in FIG. 10A is a rectangular field. The illuminated field corresponds to the area on a mirror onto which a bundle of light rays running through the objective from the object side to the image side impinge. The used diameter D according to FIG. 10A is then the diameter of the envelope circle 102, which encompasses the rectangle 100, where the corners 104 of the rectangle 100 lie on the envelope circle 102. A more realistic example is shown in FIG. 10B. The illuminated field 100 has a kidney shape, which is expected for the physical mirror surfaces of the mirrors S1–S6 or the so called used areas of the mirrors S1–S6, when the field in the image plane as well as the field in the object plane is an arc shaped field as depicted in FIG. 3. The envelope circle 102 encompasses the kidney shape fully and it coincides with the edge 110 of the kidney shape at two points, 106, 108. The used diameter D of the physical mirror surface or the used area of the mirrors S1–S6 is then given by the diameter of the envelope circle 102.

Thus, the invention provides a six-mirror projection objective with an imaging scale of preferably 4×, 5× or 6× for use in an EUV projection system.

Other uses may be employed, however. The six-mirror projection objective has the resolution required for the image field, which is e.g. arc-shaped and has a advantageous structural design, since the aspheres of the mirror surfaces are relatively low, the angles of incidence of the rays of the bundle of light rays impinging the mirror surfaces are small, and there is enough room for mounting the mirrors.

It should be understood by a person skilled in the art, that the disclosure content of this application comprises all possible combinations of any element(s) of any claims with any element(s) of any other claim, as well as combinations of all claims amongst each other.

What is claimed is:

1. An EUV optical projection system, comprising:
at least six mirrors (M1, M2, M3, M4, M5, M6) for imaging an object (OB) to an image (IM),
wherein at least one mirror pair is configured as an at least partially phase compensating mirror pair,
wherein said at least partially phase compensating mirror pair has a first mirror with a first incidence angle variation and a second mirror with a second incidence angle variation, and
wherein said first and said second incidence angle variation have a difference of less than 5° for a field point of a field at said object.

2. The system of claim 1, wherein said at least partially phase compensating mirror pair comprises a second mirror (M2) and a fifth mirror (M5) along an optical path from the object (OB) to the image (IM).

3. The system of claim 1, further comprising an aperture stop (APE) located along an optical path from said object (OB) to said image (IM) between a first mirror (M1) and a second mirror (M2).

4. The system of claim 3, wherein said aperture stop (APE) is not located on the first mirror (M1), and said aperture stop (APE) is not located on the second mirror (M2).

5. The system of claim 1, wherein a second mirror (M2) along an optical path from the object (OB) to the image (IM) is convex, and a third mirror (M3) along said optical path is concave.

6. An EUV optical projection system, comprising:
at least six mirrors (M1, M2, M3, M4, M5, M6) for imaging an object (OB) to an image (IM), and
an aperture stop (APE) located along an optical path from said object (OB) to said image (IM) between a first mirror (M1) and a second mirror (M2),
wherein said second mirror (M2) is convex,
wherein a third mirror (M3) along said optical path is concave,
wherein at least one mirror pair is configured as an at least partially phase compensating mirror pair,
wherein said at least partially phase compensating mirror pair has a first mirror with a first incidence angle variation and a second mirror with a second incidence angle variation, and
wherein said first and said second incidence angle variation have a difference of less than 5° for a field point of a field at said object.

7. The system of claim 6, wherein said aperture stop (APE) is not located on said first mirror (M1) and said aperture stop (APE) is not located on said second mirror (M2).

8. The system of claim 6, wherein said at least partially phase compensating mirror pair comprises said second mirror (M2) and a fifth mirror (M5) along the optical path.

9. The system of claim 1, wherein said system forms an intermediate image (IMI) along an optical path from the object (OB) to the image (IM) between a second mirror (M2) and a third mirror (M3), such that a first mirror (M1) and a second mirror (M2) form a first optical group (G1), and a third mirror (M3), a fourth mirror (M4), a fifth mirror (M5) and a sixth mirror (M6) form a second optical group (G2).

10. The system of claim 9, wherein a magnification ratio of the first optical group is between −0.8 and −1.2, and a magnification ratio of the second optical group is between −0.15 and −0.35.

11. An EUV optical projection system, comprising:
at least six mirrors (M1, M2, M3, M4, M5, M6) for imaging an object (OB) to an image (IM),
wherein said system is configured to form an intermediate image (IMI) along an optical path from the object (OB) to the image (IM) between a second mirror (M2) and a third mirror (M3), such that a first mirror (M1) and the second mirror (M2) form a first optical group (G1), and the third mirror (M3), a fourth mirror (M4), a fifth mirror (M5) and a sixth mirror (M6) form a second optical group (G2),
wherein said second mirror (M2) is convex,
wherein said third mirror (M3) is concave,
wherein at least one mirror pair is configured as an at least partially phase compensating mirror pair,
wherein said at least partially phase compensating mirror pair has a first mirror with a first incidence angle variation and a second mirror with a second incidence angle variation, and
wherein said first and said second incidence angle variation have a difference of less than 5° for a field point of a field at said object.

12. The system of claim 11, further comprising an aperture stop (APE) located along said optical path from said object (OB) to said image (IM) between said first mirror (M1) and said second mirror (M2).

13. The system of claim 12, wherein said aperture stop (APE) is not located on said first mirror (M1) and said aperture stop (APE) is not located on said second mirror (M2).

14. The system of claim 11, wherein said at least partially phase compensating mirror pair comprises the second mirror (M2) and the fifth mirror (M5).

15. The system of claim 1, wherein a first mirror (M1) along an optical path from the object (OB) to the image (IM) is concave, a second mirror (M2) is convex, a third mirror (M3) is concave, a fourth mirror (M4) is concave, a fifth mirror (M5) is convex and a sixth mirror (M6) is concave.

16. The system of at claim 1, wherein each of said six mirrors (M1, M2, M3, M4, M5, M6) is disposed between said object (OB) and said image (IM), and wherein a physical distance between said object (OB) and said image (IM) is substantially 1500 mm or less.

17. The system claim 1, wherein said system forms an image (IM) with a numerical aperture greater than 0.18.

18. The system of claim 17, wherein each of the six mirrors (M1, M2, M3, M4, M5, M6) receives a chief ray (CR) from a central field point (COP) at an incidence angle of less than substantially 16°.

19. The system of claim 17, wherein five of the six mirrors (M1, M2, M3, M4, M5, M6) receives a chief ray (CR) from a central field point (COP) at an incidence angle of less than substantially 13°.

20. The system of claim 17, wherein a beam propagating between second and third mirrors (M2, M3) along an optical path between the object (OB) and the image (IM) and a beam propagating between fourth and fifth mirrors (M4, M5) cross in the y-axis direction.

21. The system claim 1, wherein a maximum aspheric departure of a sixth mirror M6 along an optical path from the object (OB) to the image (IM) from a best fitting sphere is less than substantially 6 μm.

22. The system of claim 1, wherein said system has a RMS wavefront error of $0.017\lambda$ or less.

23. The system of claim 1, wherein said difference is smaller than 4°.

24. The system of claim 1, wherein said difference is smaller than 2.7°.

25. The system of claim 1, wherein said field is a ring field having said field point.

26. The system of claim 25, wherein said field point is a central field point.

27. An EUV optical projection system, comprising:
   a first mirror, a second mirror, a third mirror, a fourth mirror, a fifth mirror and a sixth mirror, for imaging an object to an image; and
   an aperture stop located along an optical path from said object to said image, between said first mirror and second mirror,
   wherein, along said optical path, said second mirror is convex, said third mirror is concave, said fifth mirror is convex and said sixth mirror is concave,
   wherein said system forms an intermediate image along an optical path from said object to said image,
   wherein said intermediate image is formed between said second mirror and said third mirror,
   wherein said first mirror and said second mirror form a first optical group, and
   wherein said third mirror, said fourth mirror, said fifth mirror and said sixth mirror form a second optical group.

28. The EUV optical projection system of claim 27, wherein said first mirror is concave.

29. The EUV optical projection system of claim 27, wherein, along said optical path, said fourth mirror is concave.

30. The EUV optical projection system of claim 27, wherein said aperture stop is not located on said first mirror and not located on said second mirror.

31. The EUV optical projection system of claim 27,
   wherein said first optical group has a magnification ratio between about −0.8 and about −1.2, and
   wherein said second optical group has a magnification ratio between about −0.15 and about −0.35.

* * * * *